United States Patent
Athikessavan et al.

(10) Patent No.: US 11,959,978 B2
(45) Date of Patent: Apr. 16, 2024

(54) METHOD OF DETECTING A ROTOR BAR FAULT AND A METHOD OF ESTIMATING AN ADDITIONAL OPERATING EXPENDITURE DUE TO ONE OR MORE MECHANICAL ANOMALIES IN AN ELECTRICAL MACHINE

(71) Applicants: Sembcorp Industries Ltd, Singapore (SG); National University of Singapore, Singapore (SG)

(72) Inventors: Subash Chandar Athikessavan, Singapore (SG); Sanjib Kumar Panda, Singapore (SG); Shiva Shankaranarayanan Muthuraj, Singapore (SG)

(73) Assignees: Sembcorp Industries Ltd, Singapore (SG); National University of Singapore, Singapore (SG)

( * ) Notice: Subject to any disclaimer, the term of this patent is extended or adjusted under 35 U.S.C. 154(b) by 245 days.

(21) Appl. No.: 17/632,760

(22) PCT Filed: Aug. 4, 2020

(86) PCT No.: PCT/SG2020/050452
§ 371 (c)(1),
(2) Date: Feb. 3, 2022

(87) PCT Pub. No.: WO2021/025620
PCT Pub. Date: Feb. 11, 2021

(65) Prior Publication Data
US 2022/0276307 A1    Sep. 1, 2022

(30) Foreign Application Priority Data
Aug. 5, 2019  (WO) ............... PCT/SG2019/050389

(51) Int. Cl.
G01R 31/72   (2020.01)
G01R 31/34   (2020.01)
G01R 31/52   (2020.01)

(52) U.S. Cl.
CPC ........... *G01R 31/72* (2020.01); *G01R 31/343* (2013.01); *G01R 31/346* (2013.01); *G01R 31/52* (2020.01)

(58) Field of Classification Search
CPC .... G01R 31/72; G01R 31/343; G01R 31/346; G01R 31/52; G01R 31/62; H02P 29/024
(Continued)

(56) References Cited

U.S. PATENT DOCUMENTS

| 6,262,550 B1 | 7/2001 | Kliman et al. |
| 2005/0046414 A1 | 3/2005 | Payne et al. |
| 2014/0049285 A1* | 2/2014 | Rodriguez ............. G01H 1/003 324/765.01 |

FOREIGN PATENT DOCUMENTS

| AU | 2017100471 A4 | 6/2017 |
| CN | 201177650 Y | 1/2009 |

(Continued)

OTHER PUBLICATIONS

Extended European Search Report dated Jul. 28, 2023 in European Patent Application No. 20849619, 7 pages.
(Continued)

*Primary Examiner* — Farhana A Hoque
(74) *Attorney, Agent, or Firm* — Kilpatrick Townsend & Stockton LLP

(57) ABSTRACT

A method of detecting a rotor bar fault of an electrical machine, said method comprising, acquiring a set of online signals from the electrical machine over a period, said set of online signals comprising at least one vibration signal, and a summed signal of magnetic flux signals, each magnetic
(Continued)

flux signal obtained from a respective flux sensor positioned on an external surface of the electrical machine; extracting an online anomaly indicator value from the set of online signals; comparing the online anomaly indicator value with a baseline anomaly indicator value of a corresponding loading condition; and determining presence of the broken or cracked rotor when the online anomaly indicator value deviates from the baseline anomaly indicator value by a threshold.

25 Claims, 12 Drawing Sheets

(58) Field of Classification Search
USPC .......................................................... 324/509
See application file for complete search history.

(56) References Cited

FOREIGN PATENT DOCUMENTS

| CN | 110531259 A | 12/2019 |
|----|-------------|---------|
| RU | 2425390 C1  | 7/2011  |

OTHER PUBLICATIONS

Pöyhönen S., et al., Independent Component Analysis of Vibrations for Fault Diagnosis of an Induction Motor. *Proceedings of the IASTED International Conference on Circuits, Signals, and Systems (CSS 2003)*, Cancun, Mexico, May 19, 2003, vol. 1, pp. 203-208.
International Application No. PCT/SG2020/050452 received an International Search Report and Written Opinion dated Nov. 23, 2020, 13 pages.

* cited by examiner

METHOD OF DETECTING A ROTOR BAR FAULT AND A METHOD OF ESTIMATING AN ADDITIONAL OPERATING EXPENDITURE DUE TO ONE OR MORE MECHANICAL ANOMALIES IN AN ELECTRICAL MACHINE

TECHNICAL FIELD

The present disclosure relates broadly to a method of detecting a rotor bar fault and a method of estimating an additional operating expenditure due to one or more mechanical anomalies in an electrical machine.

BACKGROUND

Electrical machines e.g. rotating electrical machines such as induction motors and generators are the workhorses of modern industries. Rotating electrical machines are widely used in various applications such as electric vehicles, power plants, cranes, elevators, printing machines, rolling (metal work), cooling and ventilation systems, pumps for fluid circulation, marine and train propulsion systems, in industries such as chemical, paper, pulp, cement, textile, packaging etc.

Rotating electrical machines can experience a variety of faults such as drive-train failure, bearing faults, cracked or broken rotor bars faults, and other mechanical anomalies such as misalignment, unbalance, or mechanical looseness. Broken rotor bars faults can cause the broken parts to hit stator windings at high velocity, resulting in failures of the rotating electrical machines. Mechanical anomalies in rotating electrical machines can lead to additional input current which in turn reduces the efficiency thereof.

Unexpected catastrophic failure of rotating electrical machines can lead to excessive losses in terms of revenue and/or can endanger lives and goods. Therefore, there is a need to detect any faults in the rotating electrical machines to reduce the losses caused by such faults. Continuous monitoring of rotating electrical machines is important to mitigate any unexpected catastrophic failures which could lead to significant repair-work cost and downtime losses.

Conventionally, broken-/cracked rotor faults are detected and diagnosed by Motor Current Signature Analysis (MCSA) and vibration signature analysis. Mechanical faults in rotor bars produce vibrations in radial rotor movement which in turn produce torque oscillations at the rotor mechanical rotating frequency. By monitoring the rotational frequency component in the current, and pole pass frequency or rotor bar pass frequency components in vibration signal, mechanical faults associated with the rotor bars can be detected. However, current and vibration signals are less sensitive to detect the broken rotor bar fault at an early stage.

Currently, vibration-based maintenance scheduling is widely adopted in various industries. However, such vibration-based maintenance scheduling does not consider the additional operating expenditure (OPEX) until the vibration level reaches "unacceptable" or "not recommended" values as per ISO standards. This can lead to additional expenses incurred due to mechanical anomalies in the equipment, until the next scheduled maintenance is reached. The failure to schedule earlier maintenance can also reduce the operating lifespan of the equipment, thereby reducing utilization of the equipment's useful life.

Thus, there is a need for a method of detecting a rotor bar fault and a method of estimating an additional operating expenditure due to one or more mechanical anomalies in an electrical machine, which seek to address or at least ameliorate one of the above problems.

SUMMARY

According to one aspect, there is provided a method of detecting a rotor bar fault of an electrical machine, said method comprising, acquiring a set of online signals from the electrical machine over a period, said set of online signals comprising at least one vibration signal, and a summed signal of magnetic flux signals, each magnetic flux signal obtained from a respective flux sensor positioned on an external surface of the electrical machine; extracting an online anomaly indicator value from the set of online signals; comparing the online anomaly indicator value with a baseline anomaly indicator value of a corresponding loading condition; and determining presence of the broken or cracked rotor when the online anomaly indicator value deviates from the baseline anomaly indicator value by a threshold.

The electrical machine may be a motor or generator comprising, a stator having a cylindrical frame, the cylindrical frame comprising a plurality of electrically conductive windings arranged therein; a rotor having a cylindrical body concentrically mounted and rotatable within the cylindrical frame of the stator, said rotor having a drive end and a non-drive end; and an elongated shaft member coaxially mounted to the rotor, said shaft member protruding from the rotor at the drive end.

The step of acquiring the set of online signals from the electrical machine may comprise, acquiring and summing a set of p flux signals to obtain a total flux signal, wherein the set of p flux signals is acquired from p flux sensors positioned proximate the stator along the circumference of its cylindrical frame, such that any two adjacent flux sensors along the circumference of the cylindrical frame has an angular separation of 360/p degrees with respect to the longitudinal axis of the cylindrical frame, wherein p represents the total number of poles of the motor or generator; acquiring one or more vibration signals from an accelerometer; and optionally acquiring either a phase current or a line current of the electrical machine.

The method may further comprise, computing a set of online load values from the set of online signals, said set of online load values is one or more selected from the group consisting of shaft speed value, slip value and RMS value of a phase current or line current of the electrical machine.

The step of extracting the online anomaly indicator value from the set of online signals may comprise computing an RMS value of magnitudes of one or more frequency components of the total flux signal, said frequency components associated with the rotor bar fault.

The step of computing the RMS value may comprise performing a Fourier transform on the total flux signal; and extracting magnitudes of frequency components from the frequency spectrum of the total flux signal.

The method may further comprise performing an initial calibration of the electrical machine when the electrical machine is in a healthy condition, prior to the acquiring of the set of online signals, the initial calibration comprising, acquiring and storing a set of baseline load values under a range of loading conditions from no-load condition to full-load condition, wherein the set of baseline load values is one or more selected from the group consisting of shaft speed value, slip value, and RMS value of a phase current or line current of the electrical machine.

The initial calibration may further comprise extracting a set of baseline anomaly indicator values corresponding to a set of loading conditions ranging from no-load condition to full-load condition, when the electrical machine is in the healthy condition; wherein extracting a baseline anomaly indicator value for a corresponding loading condition comprises, acquiring and summing a set of p flux signals to obtain a total flux signal for the corresponding loading condition; performing a Fourier transform on the total flux signal to obtain a magnitude of the total flux signal; and extracting a magnitude of frequency components from a frequency spectrum of the total flux signal.

The method may further comprise identifying the corresponding loading condition, prior to comparing the online anomaly indicator value with the baseline anomaly indicator value of the corresponding loading condition, wherein the step of identifying the corresponding loading condition comprises, comparing the set of online load values from the electrical machine with the set of baseline load values to identify the corresponding loading condition; and selecting the baseline anomaly indicator value for the identified corresponding loading condition.

The method may further comprise providing input of parameter values of the electrical machine, said parameter values comprising the number of poles, full-load current and full-load slip of the electrical machine.

According to another aspect, there is provided a non-transitory computer readable storage medium having stored thereon instructions for instructing a processing unit of a system to execute a method of detecting a broken or cracked rotor bar during online operation of an electrical machine, said method comprising, acquiring a set of online signals from the electrical machine over a period, said set of online signals comprising at least one vibration signal, a summed signal of magnetic flux signals, each magnetic flux signal obtained from a respective flux sensor positioned on an external surface of the electrical machine; extracting an online anomaly indicator value from the set of online signals; comparing the online anomaly indicator value with a baseline anomaly indicator value of a corresponding loading condition; and determining presence of the broken or cracked rotor when the online anomaly indicator value deviates from the baseline anomaly indicator value by a threshold.

According to another aspect, there is provided a method of estimating an additional operating expenditure due to one or more mechanical anomalies in an electrical machine, the method comprising, acquiring a set of online signals from the electrical machine over a period, said set of signals comprising at least one vibration signal, at least one magnetic flux signal and at least one current signal; extracting an online anomaly indicator value from the set of online signals; comparing the online anomaly indicator value with a baseline anomaly indicator value of a corresponding loading condition; determining presence of mechanical anomaly when the online anomaly indicator value deviates from the baseline anomaly indicator value by a threshold; and computing the additional operating expenditure over a time frame, said time frame starting from an instance when the mechanical anomaly is determined until an instance when an overall vibration velocity of the electrical machine is projected to reach a defined unacceptable range.

The electrical machine may be a motor or generator comprising, a stator having a cylindrical frame, the cylindrical frame comprising a plurality of electrically conductive windings arranged therein; a rotor having a cylindrical body concentrically mounted and rotatable within the cylindrical frame of the stator, said rotor having a drive end and a non-drive end; and an elongated shaft member coaxially mounted to the rotor, said shaft member protruding from the rotor at the drive end.

The step of acquiring the set of online signals from the electrical machine may comprise, acquiring at least one vibration signal from an accelerometer; acquiring and summing a set of p flux signals to obtain a total flux signal, wherein the set of p flux signals is acquired from p flux sensors positioned proximate the stator along the circumference of its cylindrical frame, such that any two adjacent flux sensors along the circumference of the cylindrical frame has an angular separation of 360/p degrees with respect to the longitudinal axis of the cylindrical frame, wherein p represents the total number of poles of the motor or generator; and acquiring either a phase current or a line current of the electrical machine.

The method may further comprise, computing a set of online load values from the set of online signals, said set of online load values is one or more selected from the group consisting of shaft speed value, slip value and RMS value of a phase current or line current of the electrical machine.

The step of extracting the online anomaly indicator value from the set of signals may comprise, computing an RMS value of magnitudes of one or more frequency components of the total flux signal, or an RMS value of magnitudes of one or more frequency components of the phase or line current, said frequency components associated with the mechanical anomaly.

The step of computing the RMS value comprises performing a Fourier transform on the total flux signal or the phase or line current; and extracting magnitudes of frequency components from the frequency spectrum of the total flux signal or the phase or line current.

The method may further comprise performing an initial calibration of the electrical machine when the electrical machine is in a healthy condition, prior to the acquiring of the set of online signals, the initial calibration comprising, acquiring and storing a set of baseline load values under a range of loading conditions from no-load condition to full-load condition, wherein the set of baseline load values is one or more selected from the group consisting of shaft speed value, slip value, and RMS value of a phase current or line current of the electrical machine.

The initial calibration may further comprise extracting a set of baseline anomaly indicator values corresponding to a set of loading conditions ranging from no-load condition to full-load condition, when the electrical machine is in the healthy condition.

The method may further comprise identifying the corresponding loading condition, prior to comparing the online anomaly indicator value with the baseline anomaly indicator value of the corresponding loading condition, wherein the step of identifying the corresponding loading condition comprises, comparing the set of online load values from the electrical machine with the set of baseline load values to identify the corresponding loading condition; and selecting the baseline anomaly indicator value for the corresponding loading condition.

The step of computing the additional operating expenditure over the time frame may comprise, computing power loss, additional current due to the one or more mechanical anomalies, and overall vibration velocity at regular time intervals; and storing the computed power loss, additional current due to the one or more mechanical anomalies, and overall vibration velocity in a database.

The step of computing the additional operating expenditure over the time frame may further comprise, computing a trend of the overall vibration velocity based on the computed overall vibration velocity stored in the database; determining from the trend of the overall vibration velocity, the instance when an overall vibration velocity of the electrical machine is at the defined unacceptable range; and computing the additional operating expenditure over the time frame.

The method may further comprise inputting parameter values of the electrical machine, said parameter values comprising the number of poles, full-load current, full-load slip, electricity tariff, stator resistance, rotor resistance, and RMS value of actual current due to mechanical anomaly signatures in the phase or line current.

The method may further comprise, prior to the extracting of online anomaly indicator value from the set of online signals, obtaining an overall vibration velocity of the electrical machine from the at least one vibration signal; comparing the overall vibration velocity with a recommended value or range of values for the vibration velocity of the electrical machine; and triggering a signal for maintenance when the overall vibration velocity deviates from the recommended value or range of values.

According to another aspect, there is provided a non-transitory computer readable storage medium having stored thereon instructions for instructing a processing unit of a system to execute a method of estimating an additional operating expenditure due to one or more mechanical anomalies in an electrical machine, said method comprising, acquiring a set of online signals from the electrical machine over a period, said set of signals comprising at least one vibration signal, at least one magnetic flux signal and at least one current signal; extracting an online anomaly indicator value from the set of online signals; comparing the online anomaly indicator value with a baseline anomaly indicator value of a corresponding loading condition; determining presence of mechanical anomaly when the online anomaly indicator value deviates from the baseline anomaly indicator value by a threshold; and computing the additional operating expenditure over a time frame, said time frame starting from an instance when the mechanical anomaly is detected until an instance when an overall vibration velocity of the electrical machine reaches a defined unacceptable range.

BRIEF DESCRIPTION OF THE DRAWINGS

Example embodiments of the invention will be better understood and readily apparent to one of ordinary skill in the art from the following written description, by way of example only, and in conjunction with the drawings, in which.

DETAILED DESCRIPTION

Figure 1:
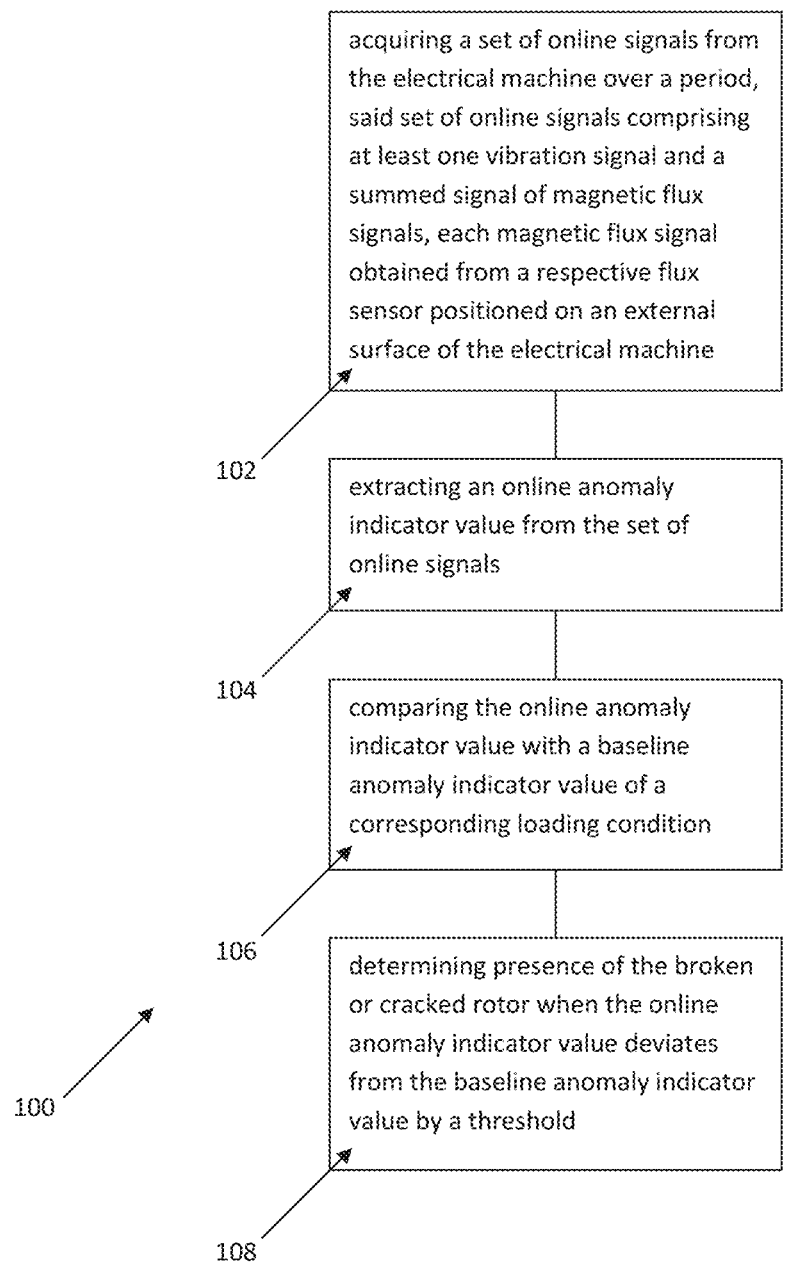
FIG. 1 is a schematic flowchart for illustrating a method of detecting a rotor bar fault in an electrical machine in an example embodiment.

Example, non-limiting embodiments may provide a method of detecting a rotor bar fault and a method of estimating an additional operating expenditure due to one or more mechanical anomalies in an electrical machine.

In various example embodiments, the term "electrical machine" as used herein refers to machines which convert energy from one form to another, e.g. mechanical energy into electrical energy or vice versa. Electrical machines may include but are not limited to motors (which converts electricity to mechanical power), and generators (which converts mechanical power to electricity) and the like. The electrical machine comprises at least a first electrically conductive member for receiving power and at least a second electrically conductive member or at least one permanent magnet for electromagnetic or electromechanical energy conversion.

In various example embodiments, the electrical machine may be a motor or a generator. The motor may include but is not limited to an AC motor such as single- or poly-phase asynchronous motor (induction motor), single- or poly-phase synchronous motor, linear-induction or -synchronous motor. The generators may include but is not limited to a self- or separately-excited DC generator, single- or poly-phase brushless synchronous generator, single- or poly-phase brushed synchronous generator, single- or poly-phase permanent magnet synchronous generator, turbo-alternator, single- or poly-phase asynchronous generator (induction generators), marine-alternator, salient- or non-salient pole alternator or automotive alternator.

In various example embodiments, the method of detecting a rotor bar fault and a method of estimating an additional operating expenditure due to one or more mechanical anomalies in an electrical machine are performed while the machine is under online operating condition. In various example embodiments, the method of detecting a rotor bar fault and a method of estimating an additional operating expenditure due to one or more mechanical anomalies in an electrical machine are performed in real-time while the machine is under online operating condition. During online operation, the electrical machine is energized (i.e. switched on or powered on).

For example, if the machine is an induction motor (IM), the IM is energized by passing a varying electric current through the first electrically conductive member e.g. stator winding of the IM to produce varying magnetic fluxes, such that the varying magnetic fluxes are capable of inducing the rotor (and mounted shaft member) to rotate about their respective longitudinal axis by (i) inducing a current in the second electrically conductive member e.g. rotor winding of the IM, or (ii) locking with the rotor poles of a permanent magnet comprised in the rotor, or (iii) locking with the rotor poles generated by an applied DC voltage to the rotor winding. As a result, conversion of electrical energy to mechanical energy is performed/achieved/implemented by the IM.

For example, if the machine is a generator, the generator is driven by a prime mover such as an electric motor or turbine or an engine, such that the rotor (and mounted shaft member) rotate about their respective longitudinal axis. A DC voltage is then applied to the second electrically conductive member e.g. rotor winding of the generator, or a permanent magnet rotor comprised in the rotor, such that the varying magnetic fluxes from the second electrically conductive member links with the first electrically conductive member e.g. stator winding of the generator. Thus, the varying magnetic flux produced by the rotation of the rotor and shaft member of the generator is capable of inducing an electro motive force in the windings of the stator. As a result, conversion of mechanical energy to electrical energy is performed/achieved/implemented by the generator.

In various example embodiments, a rotor bar fault may be a cracked or broken rotor bar fault. A cracked or broken rotor bar fault occurs when one or more of the rotor bars or end rings in an electrical machine (e.g. induction motor or generator) are partially cracked or completely broken. Causes of cracked or broken rotor bar fault may be due to manufacturing defect, thermal stress and mechanical stress caused by bearing faults, frequent starts of the motor at rated voltage, and/or fatigue of metal of the rotor bar etc. In various embodiments, a mechanical anomaly in an electrical machine may include unbalance of a rotor, misalignment of the rotor, structural-looseness or rotor-looseness and a combination thereof.

FIG. 1 is a schematic flowchart 100 for illustrating a method of detecting a rotor bar fault in an electrical machine in an example embodiment. At step 102, a set of online signals is acquired from the electrical machine over a period, said set of online signals comprising at least one vibration signal and a summed signal of magnetic flux signals, each magnetic flux signal obtained from a respective flux sensor positioned on an external surface of the electrical machine. At step 104, an online anomaly indicator value is extracted from the set of online signals. At step 106, the online anomaly indicator value is compared with a baseline anomaly indicator value of a corresponding loading condition. At step 108, the presence of the broken or cracked rotor is determined when the online anomaly indicator value deviates from the baseline anomaly indicator value by a threshold.

The set of signals acquired from the electrical machine may include but is not limited to mechanical signals, magnetic signals and electrical signals. Mechanical signals may include but are not limited to vibration signals e.g. motor vibration signals such as acceleration. Magnetic signals may include but are not limited to magnetic flux signals e.g. magnetic leakage flux signals such as end-shield leakage flux signals. Electrical signals may include but is not limited to phase- or line-current of the electrical machine. In some example embodiments, the set of signals acquired from the electrical machine is one or more selected from the group consisting of vibration signal, magnetic leakage flux signal, and phase- or line-current of the electrical machine. In some example embodiments, the set of signals acquired from the electrical machine consists of at least one vibration signal and at least one magnetic leakage flux signal.

The magnetic signals e.g. magnetic flux signals may be measured under online operating conditions using sensors which include but are not limited to active Hall-effect based flux sensors or passive coils. The acquisition of magnetic flux signals may comprise positioning two or more flux sensors on the external surface of the electrical machine, prior to acquiring the set of signals from the electrical machine over a period. External surfaces of the electrical machine may include surfaces such as the outer/exterior aspects of the machine or exposed surfaces which include but are not limited to the outer/exterior aspects of the electrical machine. The external surfaces of the electrical machine are accessible from outside of the electrical machine without having to dismantle the machine. In one example, an external surface of an electrical machine, e.g. an induction motor (IM), may refer to an end shield of the IM. By positioning two or more flux sensors on the external surface of the electrical machine, the method may be performed while the machine is operating online. That is, the method may be performed without taking the electrical machine offline e.g. disconnecting the electrical machine from a power system network. In addition, by positioning two or more flux sensors on the external surface of the electrical machine, the method may be performed in a non-invasive manner, i.e. without substantially dismantling the machine e.g. dismantling of stator and rotor of a motor or generator.

The mechanical signals may be measured using motion sensors which are capable of measuring displacement, velocity and/or acceleration. Motor vibration signal e.g. acceleration can be measured using one or more motion sensors e.g. accelerometer. The accelerometer can be mounted on the outer surface of the motor either at the drive-end or non-drive-end, which senses the radial or axial or both accelerations. The acceleration measured by the accelerometer may be for example due to a vibration of the electrical machine. An (additional) acceleration/vibration of the electrical machine may arise if there is a rotor bar fault or other mechanical anomalies in the electrical machine.

For electrical signals, it will be appreciated that current is inherent in most electrical systems and would be understood by a person skilled in the art. Current measurement may be acquired by the person skilled in the art using suitable methods and apparatus. For example, line/phase currents may be sensed using any of Current Transformers (CTs), Rogowski coils, shunt resistors and Hall-effect based current sensing instruments/sensors and the like.

The set of signals is acquired from the electrical machine over a period. The period refers to a time frame over which the set of signals is being acquired to detect the presence of rotor faults. The period may range from 1 second to 20 seconds, from 2 second to 19 seconds, from 3 second to 18 seconds, from 4 second to 17 seconds, from 5 second to 16 seconds, from 6 second to 15 seconds, from 7 second to 14 seconds, from 8 second to 13 seconds, from 9 second to 12 seconds, or from 10 second to 11 seconds.

The threshold may be denoted in percentages. For example, the presence of broken or cracked rotor may be determined when the online anomaly indicator value deviates from the baseline anomaly indicator value by a threshold of at least about 1%, at least about 2%, at least about 3%, at least about 4%, at least about 5%, at least about 6%, at least about 7%, at least about 8%, at least about 9%, or at least about 10%. In one embodiment, the presence of broken or cracked rotor is determined when the online anomaly indicator value deviates from the baseline anomaly indicator value by a threshold greater than about 1% to about 2%. Theoretically, a minimum threshold value setting of 1% to 2% greater than the baseline value is required for reliable fault detection. However, it will be appreciated that the threshold value setting is subjective, which can be up to 5% greater than the baseline value measured under healthy operating conditions.

In the example embodiment, the method may further comprise a calibration step e.g. an initial calibration, prior to the step of acquiring the set of online signals from the electrical machine. During calibration, a set of Baseline Load Values (BLVs) may be measured and stored in a database for various loading conditions. The set of BLVs may be one or more selected from the group consisting of speed value e.g. shaft speed value, slip value, and current value e.g. RMS value of a phase current or line current of the electrical machine. A Load Value Threshold (LVT) may be selected. The LVT may be ±1%, ±2%, ±3%, ±4%, ±5%, ±6%, ±7%, ±8%, ±9%, or ±10% of the BLVs. During calibration, a set of Baseline Anomaly Indicator Values (BAIVs) may also be measured and stored in a database for various loading conditions. Each BAIV represents the baseline value for a healthy electrical machine (i.e. without presence of rotor bar fault) under a defined loading condition. An Anomaly Indicator Threshold (AIT) may be selected. The AIT may be ±1%, ±2%, ±3%, ±4%, ±5%, ±6%, ±7%, ±8%, ±9%, or ±10% of the BAIVs.

The various loading conditions may range from a no-load (i.e. 0% loading) condition to a full-load (i.e. 100% loading) condition of the electrical machine. BLVs may be measured from 0% loading to 100% loading of the electrical machine in increments of 1% loading (e.g. 0%, 1%, 2%, 3%, 4%, 5% etc.), in increments of 2% loading (e.g. 0%, 2%, 4%, 6%, 8%, 10% etc.), in increments of 5% loading (e.g. 0%, 5%, 10%, 15%, 20%, 25% etc.), in increments of 10% loading (e.g. 0%, 10%, 20%, 30%, 40%, 50% etc.), or in increments of 20% loading (e.g. 0%, 20%, 40%, 60%, 80%, 100% etc.) of the electrical machine.

Example embodiments of the method may advantageously allow continuous online monitoring of the electrical machine for broken or cracked rotor bar, even while the machine is operating online. The method can be performed with sensors which can be easily retrofitted to the external surfaces of an existing machine e.g. motor or generator without dismantling the machine, thereby providing a non-invasive means to detect broken or cracked rotor bar. Even more advantageously, example embodiments of the method may be about 30% more sensitive as compared to conventional techniques. The multi-signature-based condition monitoring allows for anomaly detection under wide operating conditions and avoids spurious alarms.

Figure 2A:
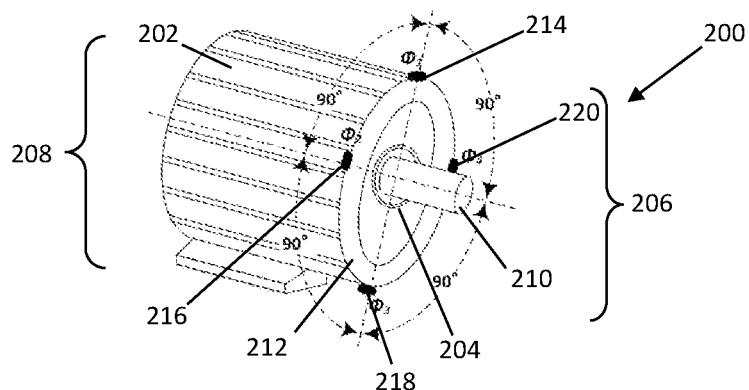
FIG. 2A is a perspective view drawing of an electrical machine e.g. rotating electromagnetic machine such as induction motor or generator in an example embodiment.

FIG. 2A is a perspective view drawing of an electrical machine 200 e.g. rotating electromagnetic machine 200 such as induction motor or generator in an example embodiment. The rotating electromagnetic machine 200 comprises a stator 202 having a cylindrical frame and a rotor 204 having a cylindrical body concentrically positioned/mounted and rotatable within the cylindrical frame of the stator 202. The stator 202 comprises a plurality of electrically conductive windings (not shown) arranged therein and a pair of end shields e.g. 212 provided at both ends of the cylindrical frame of the stator 202. The rotating electromagnetic machine 200 comprises a drive end 206 and a non-drive end 208. The rotor 204 comprises an elongated shaft member 210, said elongated shaft member 210 coaxially mounted to the rotor 204. As shown in FIG. 2A, the shaft member 210 is arranged to protrude from the rotor 204 at the drive end 206 to facilitate coupling of the rotor 204 to loads such as generators, pumps, gearboxes etc.

In various example embodiments, the methods as disclosed herein are performed while the electrical machine 200 is under online operating condition. During online operation, the electrical machine 200 is energized (i.e. switched on or powered on). Where the rotating electromagnetic machine 200 is an induction motor, the induction motor 200 may be energized by passing a varying electric current through the windings of the stator mounted by the stator frame 202 to produce varying magnetic fluxes. The varying magnetic fluxes then induces the rotor 204 and shaft member 210 to rotate about their respective longitudinal axes. Where the rotating electromagnetic machine 200 is a generator, the generator may be energized by driving the rotor 204 and shaft member 210 of the generator to rotate about their respective longitudinal axis to produce varying magnetic fluxes linked with the windings of the stator mounted by the stator frame 202. The varying magnetic fluxes are capable of inducing an electro motive force in the windings of the stator.

In various embodiments, a set of p flux signals may be acquired and summed to obtain a total flux signal. The set of p flux signals may be acquired from p flux sensors e.g. 214, 216, 218, 220 positioned proximate the stator 202 along the circumference of its cylindrical frame, such that any two adjacent flux sensors along the circumference of the cylindrical frame 202 has an angular separation of 360/p degrees with respect to the longitudinal axis of the cylindrical frame, wherein p represents the total number of poles of the motor or generator. For example, the total number of poles p may be an even number such as 2, 4, 6, 8, 10, 12, 14, 16, 18, 20, 22, 24 and the like.

As shown in FIG. 2A, sensors e.g. flux sensors 214, 216, 218, 220 are abutted/placed on the external surface of the stator 202 along the circumference of its cylindrical frame. The positions of the flux sensors 214, 216, 218, 220 are at an edge of the stator 202 proximal to the drive end 206. The flux sensors 214, 216, 218, 220 are configured to acquire/sense/measure/detect signals e.g. end shield leakage fluxes $\varphi_1$, $\varphi_2$, $\varphi_3$, $_4$. The flux sensors 214, 216, 218, 220 are positioned such that any two adjacent flux sensors e.g. 214 and 216 along the circumference of the cylindrical frame 202 has an angular separation of 360/P degrees. P is the number of poles. For example, for a 4-pole induction motor, the spatial angular separation between sensors would be 90 degrees and the number of flux sensors is four. Similarly, for a 2-pole induction motor, the spatial angular separation between sensors would be 180 degrees and the number of flux sensors is 2.

Figure 2B:
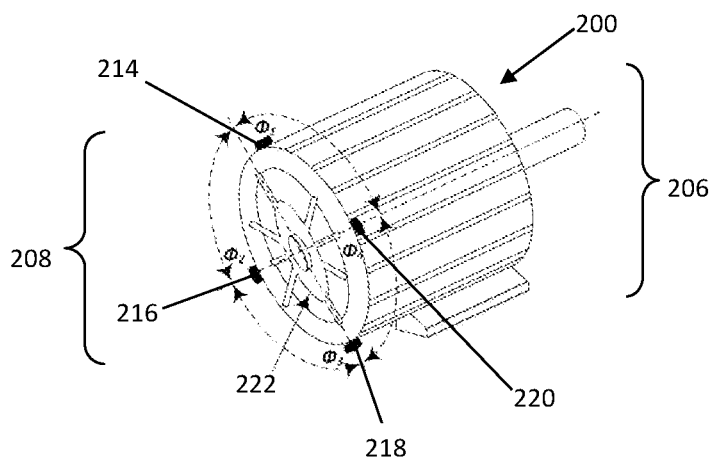
FIG. 2B is a perspective view drawing of the rotating electromagnetic machine when viewed from its non-drive end in the example embodiment.

FIG. 2B is a perspective view drawing of the rotating electromagnetic machine 200 when viewed from the non-drive end 208 in the example embodiment. As an alternative to placing sensors on the external surface of the stator frame 202 at the drive end 206 (as shown in FIG. 2A), sensors e.g. flux sensors 214, 216, 218, 220 are abutted/placed on the stator 202 along the circumference of its cylindrical frame. In FIG. 2B, the positions of the flux sensors 214, 216, 218, 220 are at an edge of the stator 202 proximal to the non-drive end 208. The flux sensors 214, 216, 218, 220 are configured to acquire/sense/measure/detect signals e.g. end shield leakage fluxes $\varphi_1$, $\varphi_2$, $\varphi_3$, $\varphi_4$. The flux sensors 214, 216, 218, 220 are positioned such that any two adjacent flux sensors e.g. 214 and 216 along the circumference of the cylindrical frame has an angular separation of 360/P degrees w.r.t (with respect to) the longitudinal axis of the cylindrical frame of the stator 202. As shown in FIG. 2B, a fan 222 is attached to the shaft member 210 at the non-drive end 208 which cools the rotating electromagnetic machine 200 under running condition.

It would be appreciated that the sensors e.g. 214, 216, 218, 220 are positioned proximate (i.e. near or at) the stator 202 along the circumference of its cylindrical frame. The position of the first sensor 214 is diametrically opposite to the third sensor 218 and the second sensor 216 is diametrically opposite to the fourth sensor 220.

Figure 2C:
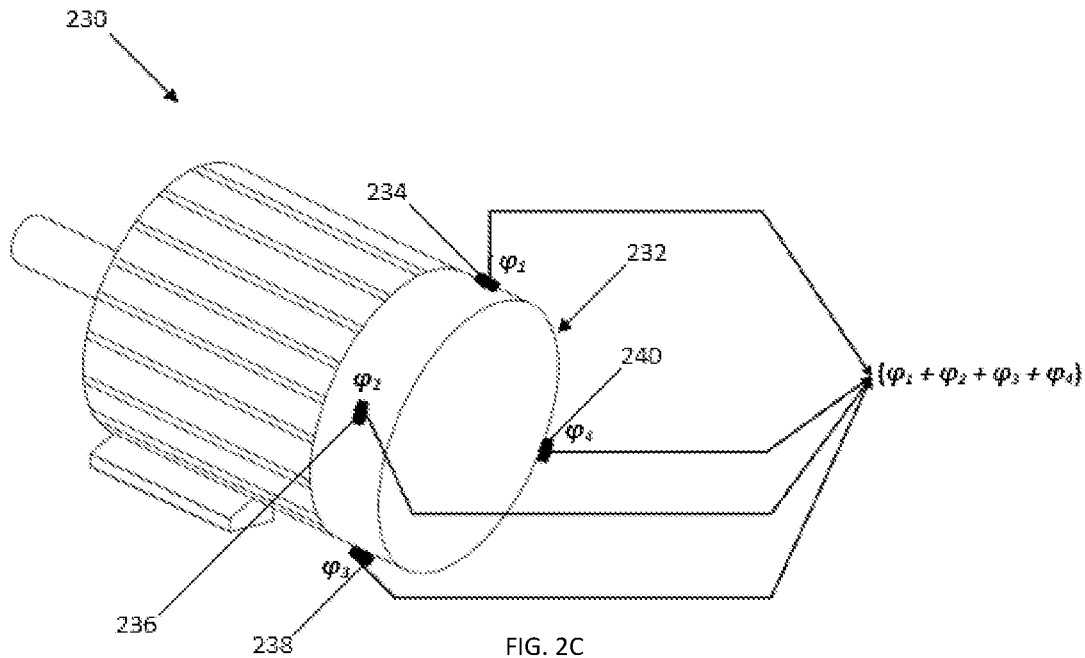
FIG. 2C is a photograph of a rotating electromagnetic machine when viewed from its non-drive end in an example embodiment.

FIG. 2C is a photograph of a rotating electromagnetic machine 230 when viewed from its non-drive end 232 in an example embodiment. The rotating electromagnetic machine 230 is substantially similar in structure and function to the rotating electromagnetic machine 230 as described in FIG. 2A and FIG. 2B. As shown in FIG. 2C, sensors e.g. flux sensors 234, 236, 238, 240 are abutted/placed proximal to the non-drive end 232 of the rotating electromagnetic machine 230, similar to the placement as shown in FIG. 2B. The flux sensors 234, 236, 238, 240 are configured to acquire/sense/measure/detect signals e.g. end shield leakage fluxes $\varphi_1$, $\varphi_2$, $\varphi_3$, $\varphi_4$, which are then summed to obtain a total flux signal of the rotating electromagnetic machine 230.

Figure 3:
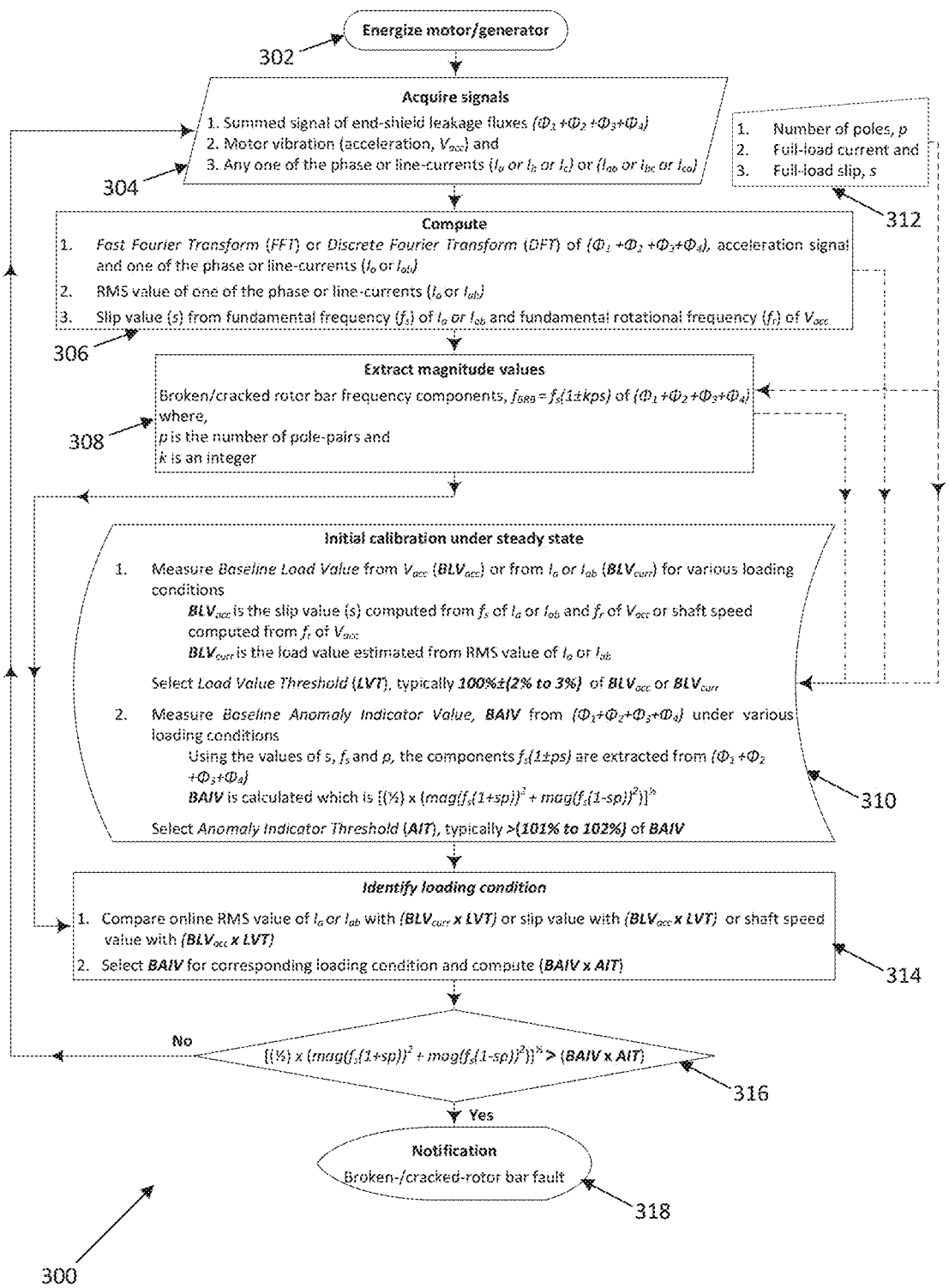
FIG. 3 is a schematic flowchart illustrating a method/technique of detecting a rotor bar fault e.g. broken or cracked rotor bar in an electrical machine e.g. an induction motor or generator in an example embodiment.

FIG. 3 is a schematic flowchart 300 illustrating a method/technique of detecting a rotor bar fault e.g. broken or cracked rotor bar in an electrical machine e.g. an induction motor or generator in an example embodiment. FIG. 3 illustrates one of the embodiments for broken-/cracked-rotor bar fault detection. A specially configured/designed monitoring system may be used to carry out the method of detecting a broken or cracked rotor bar. The method as described in FIG. 3 comprises two different stages, namely calibration stage and online monitoring stage, both of which involve data acquisition, signal processing and magnitude extraction.

At step 302, the motor or generator is energized during online operation. An example embodiment of a motor or generator is shown in FIG. 2A and FIG. 2B. A motor may be energized by passing a varying electric current through the windings of its stator to produce varying magnetic fluxes such that the varying magnetic fluxes are capable of inducing the rotor and shaft member to rotate about their respective axis. A generator may be energized by driving its rotor and shaft member to rotate about their respective longitudinal axis to produce varying magnetic fluxes linked with the windings of its stator such that the varying magnetic fluxes are capable of inducing an electro motive force in the windings of the stator.

At step 304, a set of signals/data is acquired from the electrical machine. The set of signals/data may be a set of baseline signals/data acquired from the electrical machine during calibration e.g. initial calibration. The set of signals/data may also be a set of online signals/data acquired from the electrical machine during online monitoring over a period. Data acquisition involves acquisition of signals such as summed end-shield leakage fluxes ($\varphi_1+\varphi_2+\varphi_3+\varphi_4$), motor vibration signal (acceleration, $V_{acc}$) and any one of the line-/phase-currents ($I_a$ or $I_b$ or $I_c$) or ($I_{ab}$ or $I_{bc}$ or $I_{ca}$). For a p pole machine, p number of passive or Hall-effect based non-invasive magnetic flux sensors are mounted at angular displacement $$\left(\frac{360°}{p}\right)$$

either on the drive-end or non-drive-end of the machine (compare 206 and 208 of FIGS. 2A and 2B respectively). In other words, p number of flux sensors is positioned proximate the stator along the circumference of its cylindrical frame (compare 202 of FIG. 2A and FIG. 2B), such that any two adjacent flux sensors along the circumference of the cylindrical frame has an angular separation of 360/p degrees with respect to the longitudinal axis of the cylindrical frame, wherein p represents the total number of poles of the motor or generator. A set of p leakage flux signals is acquired from the p number of flux sensors. The leakage fluxes measured/sensed by each of the flux sensors such as $\varphi_1$, $\varphi_2$, $\varphi_3$, $\varphi_4$ are then summed to obtain the summed signal ($\varphi_1+\varphi_2+\varphi_3+\varphi_4$) which are then acquired as shown in step 304. The motor vibration signal (acceleration, $V_{acc}$) may be acquired using one or more motion sensors e.g. accelerometers. The phase-current or a line-current of the electrical machine may be acquired using suitable methods and apparatus known in the art e.g. Current Transformers (CTs), Rogowski coils, shunt resistors and Hall-effect based current sensing instruments/sensors and the like.

At step 306, the acquired time-domain signals from step 304 are then converted to frequency-domain by Fast Fourier Transform (FFT) or Discrete Fourier Transform (DFT). A set of load values is then computed based on the various signals obtained. During the initial calibration stage, the computed set of load values are a set of baseline load values. During online monitoring, the computed set of load values are a set of online load values, which may be computed during online monitoring over a period, which varies from 1 second to 20 seconds. The set of load values comprises a shaft speed value, slip value and RMS value of a phase current or line current of the electrical machine. For line- or phase-current, the RMS value is calculated in time-domain. The fundamental component, $f_s$ of the line-/phase-current is extracted from the frequency spectrum of the current. The fundamental component, $f_s$ is then used to identify the rotational frequency component $f_r$ in the frequency spectrum of the vibration signal. The frequency component which is close to $$\left(\frac{2}{p}f_s\right)$$

and less than $$\left(\frac{2}{p}f_s\right)$$

in the vibration spectrum is the fundamental rotational frequency component $f_r$. From $f_s$ and $f_r$, the value of slip is then calculated which is given by $$\left(\frac{f_s - f_r}{f_s}\right).$$

The shaft speed $$\left(\frac{120 f_r}{p}\right)$$

is computed from the fundamental rotational frequency component, $f_r$ from the spectrum of vibration signal.

At step 308, the magnitude of broken-/cracked-rotor bar frequency components are extracted from the frequency spectrum of the summed end-shield leakage flux signal ($\varphi_1+\varphi_2+\varphi_3+\varphi_4$). The broken/cracked rotor bar frequency component is given by $f_{BRB}=f_s(1\pm kps)$ where, p is the number of pole-pairs, s is the full-load slip and k is an integer (k=1, k=2, k=3, k=4, . . . ). Typically, low-severity rotor faults are characterized by higher magnitudes of frequency signatures at $f_s(1\pm ps)$, and $f_s(1\pm 2 ps)$, which are obtained by substituting k=1 and k=2 in $f_{BRB}=f_s(1\pm kps)$. For high severity faults, the rotor bar frequency signatures can appear at k values of 1 to 4. As such, a nominal value of the integer k can be fixed from 1 to 4. From the broken/cracked rotor bar frequency component, an anomaly indicator value is computed using the formula:

$$\sqrt{\frac{1}{2}\left[(\text{magnitude of } (f_s(1+sp))^2+(\text{magnitude of } (f_s(1-sp))^2\right]}.$$

The anomaly indicator value can be a baseline anomaly indicator value computed during the calibration stage or an online anomaly indicator value computed during the online monitoring stage.

It will be appreciated that the functionalities from step 302 to step 308 are executed for both online monitoring and calibration stages. In the example embodiment, an initial calibration is carried out prior to commencement of the online monitoring stage. An example of an initial calibration is shown in step 310 of FIG. 3. Prior to the initial calibration, details such as number of poles (p), full-load current and full-load slip (s) of the equipment (i.e. electrical machine) to be monitored are entered by a user in the monitoring system as shown in step 312 of FIG. 3.

At step 310, during initial calibration, a set of Baseline Load Values (BLVs) are measured and stored in a database for various loading conditions. The various loading conditions may range from a no-load (i.e. 0% loading) condition to a full-load (i.e. 100% loading) condition of the electrical machine. The set of BLVs may be one or more selected from the group consisting of shaft speed value, slip value, and RMS value of a phase current or line current of the electrical machine. The BLVs can be from acceleration and line- or phase-currents $I_a$ or $I_{ab}$ which is $BLV_{acc}$ or from line- or phase-currents $I_a$ or $I_{ab}$ which is $BLV_{curr}$. The $BLV_{acc}$ can be the slip value computed for various loading conditions or the shaft speed $$\left(\frac{120 f_r}{p}\right)$$

computed from $f_r$. The $BLV_{curr}$ is the estimated loading values from the RMS values of current measured under online operating condition w.r.t (with respect to) full load current value entered by the user. A Load Value Threshold (LVT) is selected which is typically, 100%±(2% to 3%) of $BLV_{acc}$ or $BLV_{curr}$. Practically, a tolerance of ±2% to ±3% would typically be sufficient to check whether estimated value of loading under online operating condition is within the baseline value.

Apart from BLVs, a set of Baseline Anomaly Indicator Values (BAIVs) is also extracted during initial calibration. In particular, Baseline Anomaly Indicator Values (BAIVs) from the summed signal ($\varphi_1+\varphi_2+\varphi_3+\varphi_4$) under various loading conditions such as from 0% to 100% in an increment of 5%, 10% or 20% are extracted and stored. The BAIV is calculated as, $$\sqrt{\frac{1}{2}\left[(\text{magnitude of } (f_s(1+sp))^2+(\text{magnitude of } (f_s(1-sp))^2\right]}.$$

An Anomaly Indicator Threshold (AIT) is selected which is typically, >(101% to 102%) of BAIV. Theoretically, a minimum threshold value setting of 1% to 2% greater than the baseline value is required for reliable fault detection. However, it will be appreciated that the threshold value setting is subjective, which can be up to 5% greater than the baseline value measured under healthy operating conditions.

At step 314, during online monitoring of the electrical machine, a set of online load values is compared with the set of Baseline Load Values (BLVs) measured during initial calibration to identify an appropriate loading condition corresponding to the set of online load values (i.e. "corresponding loading condition"). In the example embodiment, during the online monitoring stage, the RMS value of line-/phase-current or slip value or the shaft speed from vibration signal is compared with baseline measurements multiplied by a load value threshold ($BLV_{curr} \times LVT$) or (BLV$_{acc}$×LVT). The appropriate loading condition is identified and its corresponding BAIV is selected which is then used to compare with an online anomaly indicator value in step 316.

At step 316, the online anomaly indicator value is compared with the baseline anomaly indicator value of the corresponding loading condition. A decision is determined whether the online anomaly indicator value is greater than (BAIV×AIT), i.e. whether the online anomaly indicator value is greater than the BAIV by a threshold. If the determination at step 316 is positive (i.e. the online anomaly indicator value is greater than (BAIV×AIT)), the flowchart 300 proceeds to step 318. At step 318, a notification is triggered to indicate the presence of a broken-/cracked-rotor bar. If the determination at step 316 is negative, the flowchart 300 loops back to step 304 to acquire a new set of signals.

Figure 4:
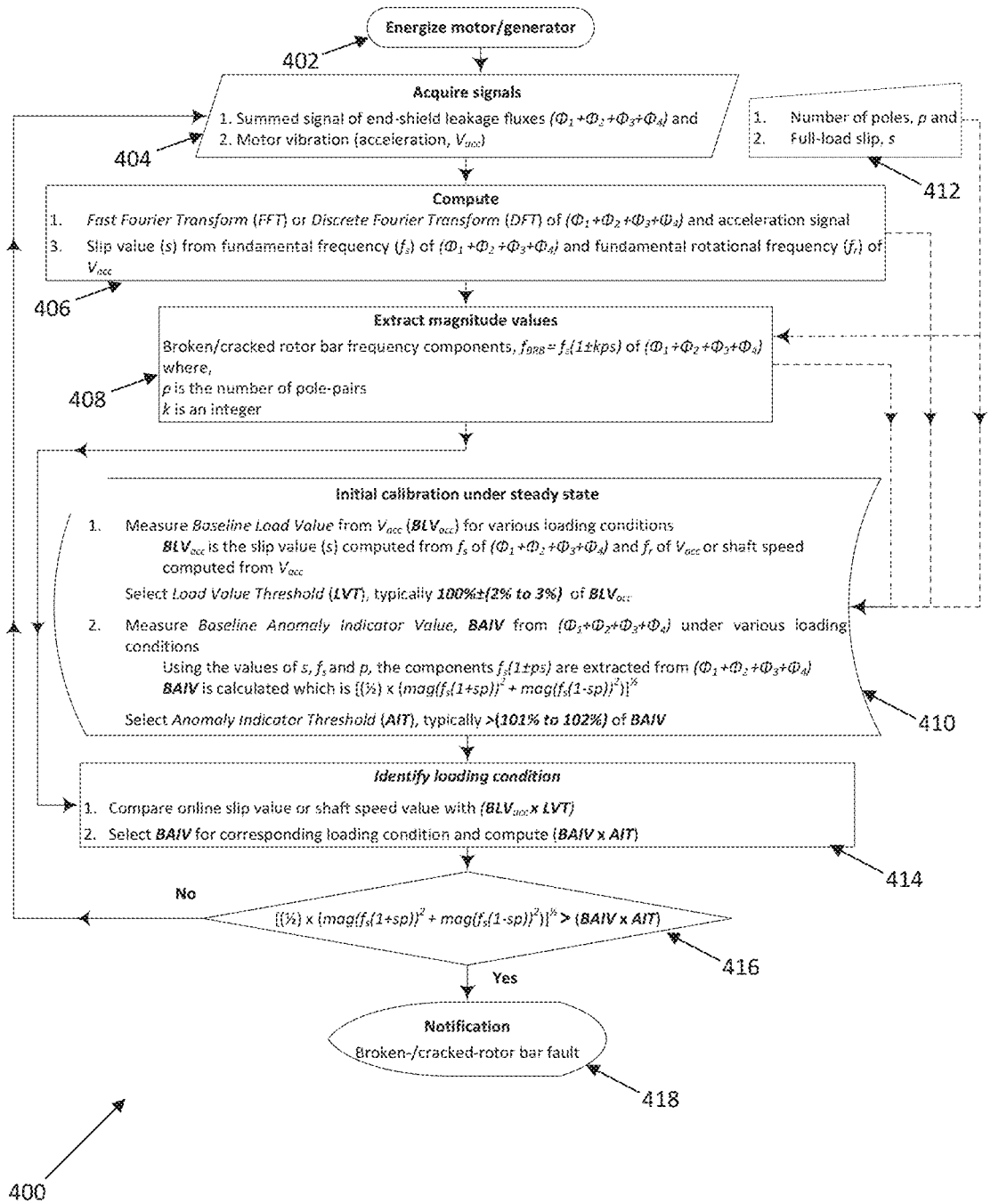
FIG. 4 is a schematic flowchart illustrating a method/technique of detecting a rotor bar fault e.g. broken or cracked rotor bar in an electrical machine e.g. an induction motor or generator in another example embodiment.

FIG. 4 is a schematic flowchart 400 illustrating a method/technique of detecting a rotor bar fault e.g. broken or cracked rotor bar in an electrical machine e.g. an induction motor or generator in another example embodiment. FIG. 4 illustrates an alternative embodiment for broken-/cracked-rotor bar fault detection. A specially configured/designed monitoring system may be used to carry out the method of detecting a broken or cracked rotor bar. The method as described in FIG. 4 comprises two different stages, namely calibration stage and online monitoring stage, both of which involve data acquisition, signal processing and magnitude extraction.

At step 402, the motor or generator is energized during online operation. An example embodiment of a motor or generator is shown in FIG. 2A and FIG. 2B. A motor may be energized by passing a varying electric current through the windings of its stator to produce varying magnetic fluxes such that the varying magnetic fluxes are capable of inducing the rotor and shaft member to rotate about their respective axis. A generator may be energized by driving its rotor and shaft member to rotate about their respective longitudinal axis to produce varying magnetic fluxes linked with the windings of its stator such that the varying magnetic fluxes are capable of inducing an electro motive force in the windings of the stator.

At step 404, a set of signals/data is acquired from the electrical machine over a period. The set of signals/data may be a set of baseline signals/data acquired from the electrical machine during calibration e.g. initial calibration. The set of signals/data may also be a set of online signals/data acquired from the electrical machine during online monitoring over a period. Data acquisition involves acquisition of signals such as summed end-shield leakage fluxes ($\varphi_1+\varphi_2+\varphi_3+\varphi_4$), and motor vibration signal (acceleration, V$_{acc}$). Unlike step 304 of FIG. 3, line-/phase-currents ($I_a$ or $I_b$ or $I_c$) or ($I_{ab}$ or $I_{bc}$ or $I_{ca}$) are not acquired in step 404. For a p pole machine, p number of passive or Hall-effect based non-invasive magnetic flux sensors are mounted at angular displacement of $$\left(\frac{360°}{p}\right)$$

either on the drive-end or non-drive-end of the machine (compare 206 and 208 of FIGS. 2A and 2B respectively). In other words, p number of flux sensors is positioned proximate the stator along the circumference of its cylindrical frame (compare 202 of FIG. 2A and FIG. 2B), such that any two adjacent flux sensors along the circumference of the cylindrical frame has an angular separation of 360/p degrees with respect to the longitudinal axis of the cylindrical frame, wherein p represents the total number of poles of the motor or generator. A set of p leakage flux signals is acquired from the p number of flux sensors. The leakage fluxes measured/sensed by each of the flux sensors such as $\varphi_1$, $\varphi_2$, $\varphi_3$, $\varphi_4$ are then summed to obtain the summed signal ($\varphi_1+\varphi_2+\varphi_3+\varphi_4$) which are then acquired as shown in step 404. The motor vibration signal (acceleration, V$_{acc}$) may be acquired using one or more motion sensors e.g. accelerometers.

At step 406, the acquired time-domain signals from step 404 are then converted to frequency-domain by Fast Fourier Transform (FFT) or Discrete Fourier Transform (DFT). A set of load values is then computed based on the various signals obtained. During the initial calibration stage, the computed set of load values are a set of baseline load values. During online monitoring, the computed set of load values are a set of online load values, which may be computed during online monitoring over a period, which varies from 1 second to 20 seconds. The set of load values may comprise a shaft speed value and slip value of the electrical machine. The slip value is computed by extracting the fundamental component, $f_s$ of the summed end-shield leakage flux signal. The fundamental component, $f_s$ is then used to identify the fundamental rotational frequency component, $f_r$ from the spectrum of vibration signal. From $f_s$ and $f_r$, the value of slip is then calculated which is given by $$\left(\frac{f_s - f_r}{f_s}\right).$$

The shaft speed $$\left(\frac{120 f_r}{p}\right)$$

is computed from the fundamental rotational frequency component, $f_r$ from the spectrum of vibration signal.

At step 408, the magnitude of broken-/cracked-rotor bar frequency components are extracted from the frequency spectrum of summed end-shield leakage flux signal ($\varphi_1+\varphi_2+\varphi_3+\varphi_4$). The broken/cracked rotor bar frequency component is given by $f_{BRB}=f_s(1\pm kps)$ where, p is the number of pole-pairs, s is the full-load slip and k is an integer (k=1, k=2, k=3, k=4, . . . ). Typically, low-severity rotor faults are characterized by higher magnitudes of frequency signatures at $f_s(1\pm ps)$, and $f_s(1\pm 2\ ps)$, which are obtained by substituting k=1 and k=2 in $f_{BRB}=f_s(1\pm kps)$. For high severity faults, the rotor bar frequency signatures can appear at k values of 1 to 4. As such, a nominal value of the integer k can be fixed from 1 to 4. From the broken/cracked rotor bar frequency component, an anomaly indicator value is computed using the formula:

$$\sqrt{\frac{1}{2}\left[(\text{magnitude of } (f_s(1+sp))^2 + (\text{magnitude of } (f_s(1-sp))^2\right]}.$$

The anomaly indicator value can be a baseline anomaly indicator value computed during the calibration stage or an online anomaly indicator value computed during the online monitoring stage.

It will be appreciated that the functionalities from step 402 to step 408 are executed for both online monitoring and calibration stages. In the example embodiment, an initial calibration is carried out prior to commencement of the online monitoring stage. An example of an initial calibration is shown in step 410 of FIG. 4. Prior to the initial calibration, details such as number of poles (p) and full-load slip (s) of the equipment (i.e. electrical machine) to be monitored are entered by a user in the monitoring system as shown in step 412 of FIG. 4.

At step 410, during initial calibration, a set of Baseline Load Values (BLVs) are measured and stored in a database for various loading conditions. The various loading conditions may range from a no-load (i.e. 0% loading) condition to a full-load (i.e. 100% loading) condition of the electrical machine. The set of BLVs may be a shaft speed value or a slip value of the electrical machine The BLVs can be from acceleration, $BLV_{acc}$ which is the slip value computed for various loading conditions or the shaft speed $$\left(\frac{120 f_r}{p}\right)$$

computed from $f_r$. A Load Value Threshold (LVT) is selected which is typically, 100%±(2% to 3%) of $BLV_{acc}$. Practically, a tolerance of ±2% to ±3% would typically be sufficient to check whether estimated value of loading under online operating condition is within the baseline value. Unlike step 310 of FIG. 3, only the vibration signals are used to calculate the BLVs in step 410 of FIG. 4.

Apart from BLVs, a set of Baseline Anomaly Indicator Values (BAIVs) is also extracted during initial calibration. In particular, Baseline Anomaly Indicator Values (BAIVs) from the summed signal $(\varphi_1+\varphi_2+\varphi_3+\varphi_4)$ under various loading conditions such as from 0% to 100% in an increment of 5%, 10% or 20% are extracted and stored. The BAIV is calculated as, $$\sqrt{\frac{1}{2}\left[(\text{magnitude of } (f_s(1+sp))^2 + (\text{magnitude of } (f_s(1-sp))^2\right]}.$$

An Anomaly Indicator Threshold (AIT) is selected which is typically, >(101% to 102%) of BAIV. Theoretically, a minimum threshold value setting of 1% to 2% greater than the baseline value is required for reliable fault detection. However, it will be appreciated that the threshold value setting is subjective, which can be up to 5% greater than the baseline value measured under healthy operating conditions.

At step 414, during online monitoring of the electrical machine, a set of online load values is compared with the set of Baseline Load Values (BLVs) measured during initial calibration to identifying an appropriate loading condition corresponding to the set of online load values (i.e. "corresponding loading condition"). In the example embodiment, during the online monitoring stage, the slip value or the shaft speed from vibration signal is compared with baseline measurements multiplied by a load value threshold (BL-$V_{acc}$×LVT). The appropriate loading condition is identified and its corresponding BAIV is selected which is then used to compare with an online anomaly indicator value in step 416.

At step 416, the online anomaly indicator value is compared with the baseline anomaly indicator value of the corresponding loading condition. A decision is determined whether the online anomaly indicator value is greater than (BAIV×AIT), i.e. whether the online anomaly indicator value is greater than the BAIV by a threshold. If the determination at step 416 is positive (i.e. the online anomaly indicator value is greater than (BAIV×AIT)), the flowchart 400 proceeds to step 418. At step 418, a notification is triggered to indicate the presence of a broken-/cracked-rotor bar. If the determination at step 416 is negative, the flowchart 400 loops back to step 404 to acquire a new set of signals.

In summary, it will be appreciated that unlike FIG. 3, line-/phase currents are not acquired in the example embodiment as illustrated by FIG. 4. In FIG. 4, the slip value is computed by extracting the fundamental component, $f_s$ of summed end-shield leakage flux signal which is then used to identify the fundamental rotational frequency component, $f_r$ from the spectrum of vibration signal as shown by step 406 of FIG. 4. Only the vibration signals are used to calculate the BLVs as shown by step 410 of FIG. 4.

Experimental Results of the Method of Detecting a Broken or Cracked Rotor Bar During Online Operation of an Electrical Machine The method of detecting a rotor bar fault e.g. broken or cracked rotor bar in an electrical machine as disclosed herein was tested under various conditions to evaluate its performance as compared to conventional techniques known in the art.

Figure 5A:
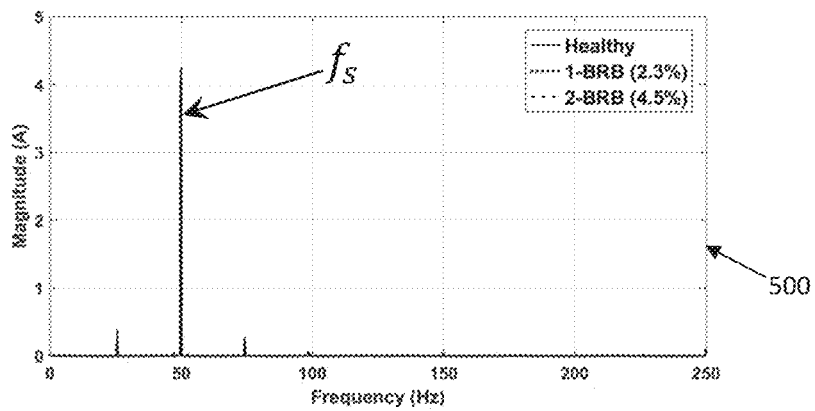
FIG. 5A is a graph presenting the frequency spectrum of line-current measured under 75% loading condition of a 2 hp (horsepower) 3-phase induction motor for 1-bar and 2-bar broken condition out of 44 rotor bars.
Figure 5B:
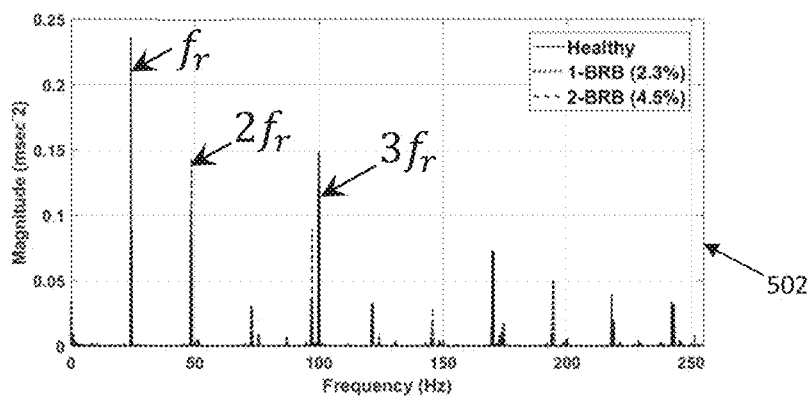
FIG. 5B is a graph presenting the frequency spectrum of acceleration measured under full-load operating condition of a 2 hp 3-phase induction motor for 1-bar and 2-bar broken condition out of 44 rotor bars.
Figure 5C:
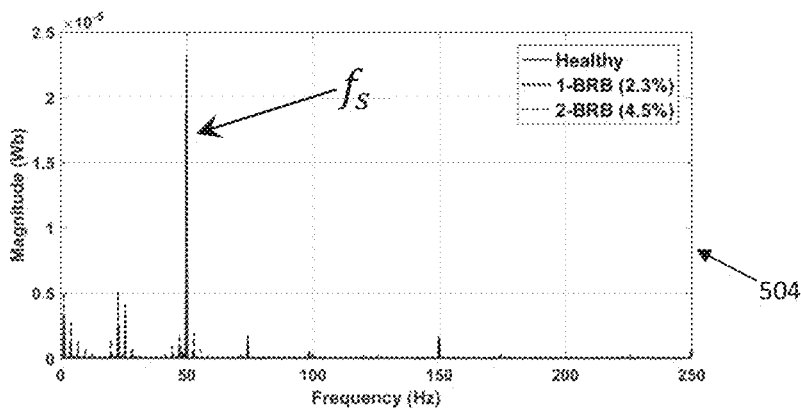
FIG. 5C is a graph presenting the frequency spectrum of summed end-shield leakage fluxes measured under full-load operating condition of a 2 hp 3-phase induction motor for 1-bar and 2-bar broken condition out of 44 rotor bars.

FIG. 5A is a graph 500 presenting the frequency spectrum of line-current measured under 75% loading condition of a 2 hp (horsepower) 3-phase induction motor for 1-bar and 2-bar broken condition out of 44 rotor bars. FIG. 5B is a graph 502 presenting the frequency spectrum of acceleration measured under full-load operating condition of a 2 hp 3-phase induction motor for 1-bar and 2-bar broken condition out of 44 rotor bars. FIG. 5C is a graph 504 presenting the frequency spectrum of summed end-shield leakage fluxes measured under full-load operating condition of a 2 hp 3-phase induction motor for 1-bar and 2-bar broken condition out of 44 rotor bars.

From FIG. 5A and FIG. 5C, the fundamental components, $f_s$ of line-current and summed end-shield leakage fluxes are characterized by the highest magnitudes in the frequency spectrum. The fundamental components $f_s$ can thus be easily extracted and then used to identify the fundamental rotational frequency component $f_r$ in the vibration frequency spectrum as shown in FIG. 5B. The frequency component which is close to $$\left(\frac{2}{p}f_s\right)$$

and less than $$\left(\frac{2}{p}f_s\right)$$

in the vibration spectrum is the fundamental rotational frequency component $f_r$. Using the value of $f_s$ and $f_r$, slip is calculated which is then used to extract the broken-/cracked-rotor bar frequency signatures as given by $f_{BRB}=f_s(1\pm kps)$.

Figure 6A:
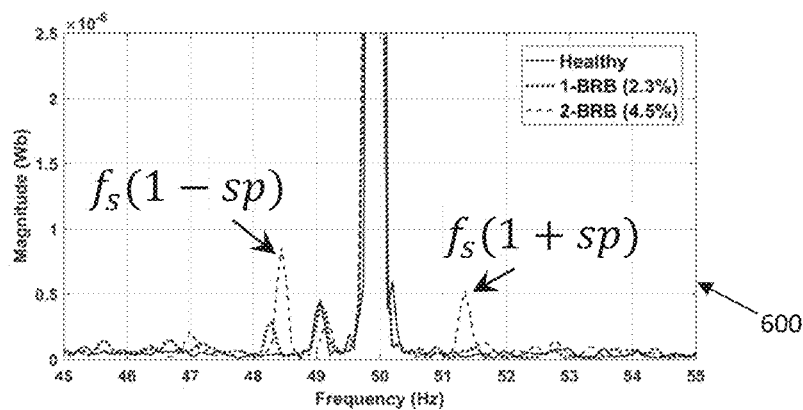
FIG. 6A is a graph presenting the frequency spectrum of summed end shield leakage flux signal under 47% loading conditions and a full-load slip of 1.5% of a 2 hp 3-phase induction motor.
Figure 6B:
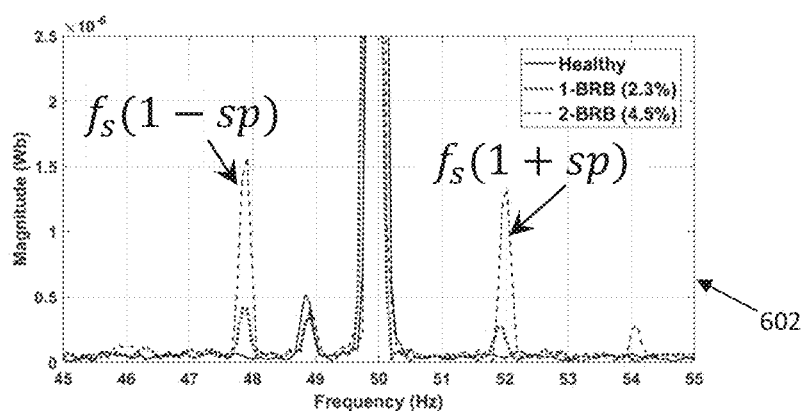
FIG. 6B is a graph presenting the frequency spectrum of summed end shield leakage flux signal under 55% loading conditions and a full-load slip of 2% of a 2 hp 3-phase induction motor.
Figure 6C:
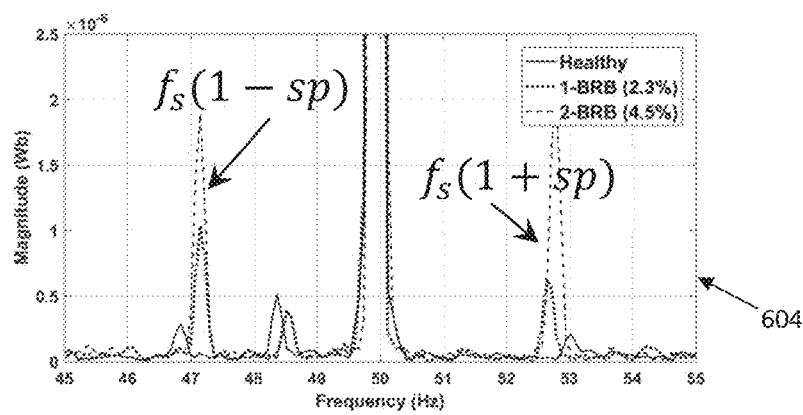
FIG. 6C is a graph presenting the frequency spectrum of summed end shield leakage flux signal under 75% loading conditions and a full-load slip of 2.7% of a 2 hp 3-phase induction motor.

FIG. 6A to FIG. 6C show graphs presenting the frequency spectrums of summed end shield leakage flux signals under various loading conditions and fault severity conditions of a 2 hp 3-phase induction motor. FIG. 6A is a graph 600 presenting the frequency spectrum of summed end shield leakage flux signal under 47% loading conditions and a full-load slip of 1.5% of a 2 hp 3-phase induction motor. FIG. 6B is a graph 602 presenting the frequency spectrum of summed end shield leakage flux signal under 55% loading conditions and a full-load slip of 2% of a 2 hp 3-phase induction motor. FIG. 6C is a graph 604 presenting the frequency spectrum of summed end shield leakage flux signal under 75% loading conditions and a full-load slip of 2.7% of a 2 hp 3-phase induction motor.

From the graphs of FIG. 6A to FIG. 6C, it is evident that side peaks are formed at frequencies of $f_s(1-sp)$ and $f_s(1+sp)$, under various fault severities and loading conditions. These side peaks are fault signatures indicative of rotor bar faults e.g. broken-/cracked-rotor bar(s), which induce the summed end-shield leakage flux signals at the frequencies of $f_s(1-sp)$ and $f_s(1+sp)$. The magnitudes of the side peaks are relatively smaller for healthy rotor bars. Therefore, the technique as disclosed herein based on summed end-shield leakage flux signals can detect the broken-/cracked-rotor bar over wide operating conditions under various fault severities.

Figure 7A:
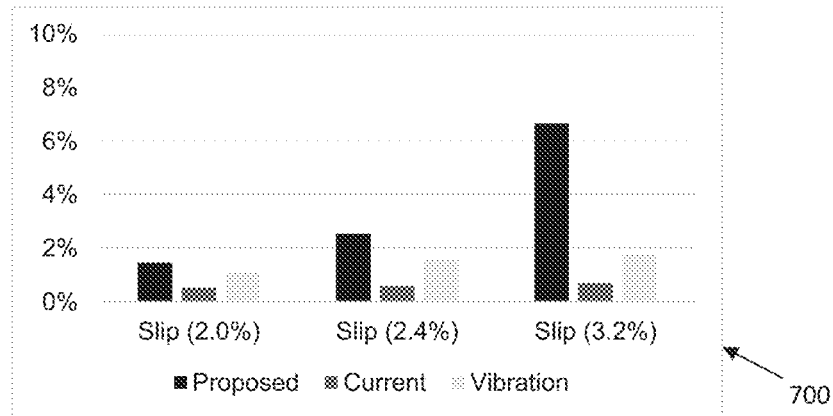
FIG. 7A is a graph presenting magnitude ratios of classical sidebands to the corresponding fundamental components of various techniques of broken rotor bar (BRB) detection for the case of 1-broken bar (2.3%).

Performance Comparison of the Method of Detecting a Broken or Cracked Rotor Bar During Online Operation of an Electrical Machine with Conventional Techniques FIG. 7A is a graph 700 presenting magnitude ratios of classical sidebands to the corresponding fundamental components of various techniques of broken rotor bar (BRB) detection for the case of 1-broken bar (2.3%). The current, vibration and summed end-shield leakage flux signals are captured for a time window of 10 seconds at a sampling frequency of 10 kHz and then FFT computation is carried out to convert time-domain signals to frequency-domain. From the frequency spectrum, the sidebands around the fundamental (supply) frequency components, which correspond to the broken rotor bar fault are extracted for current, vibration and magnetic leakage flux signals. The magnitude ratio of total RMS values of sidebands around the fundamental component to the fundamental component itself is then calculated and presented in FIG. 7A and FIG. 7B.

Figure 7B:
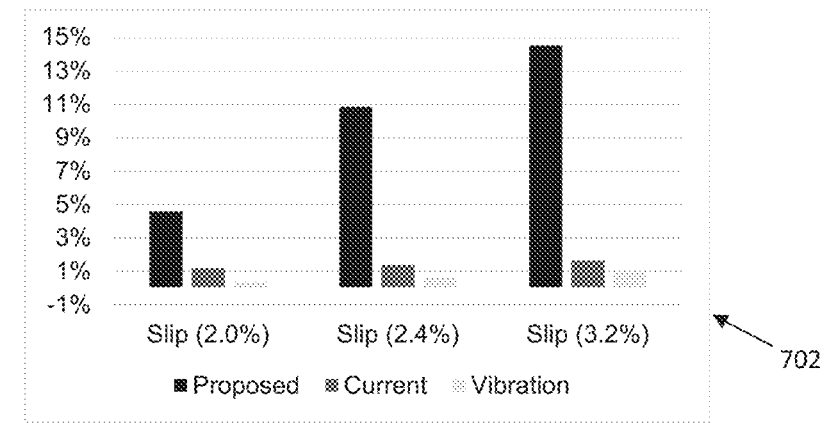
FIG. 7B is a graph presenting magnitude ratios of classical sidebands to the corresponding fundamental components of various techniques of broken rotor bar (BRB) detection for the case of 2-broken bar (4.5%).

FIG. 7B is a graph 702 presenting magnitude ratios of classical sidebands to the corresponding fundamental components of various techniques of broken rotor bar (BRB) detection for the case of 2-broken bar (4.5%). The technique as disclosed herein is labelled "Proposed", motor current signature analysis (MCSA) technique is labelled "Current" and "MCSA", and vibration-based technique is labelled "Vibration".

The lowest magnitude ratio occurs at 1-broken rotor bar fault under 2% slip as shown in FIG. 7A for which the technique as disclosed herein (labelled "Proposed") is 30% more sensitive with respect to conventional terminal current and vibration-based techniques. For cracked rotor bar detection using classical sidebands around synchronous component, the percent deviation of the technique as disclosed herein is better than the traditional vibration-based technique. MCSA was observed to be the least sensitive technique. Therefore, the results show that the technique as disclosed herein is superior to MCSA and vibration-based techniques when using classical sideband analysis. The technique as disclosed herein can detect broken-/cracked rotor fault much earlier when compared to existing techniques which are widely practiced in industries.

Figure 8:
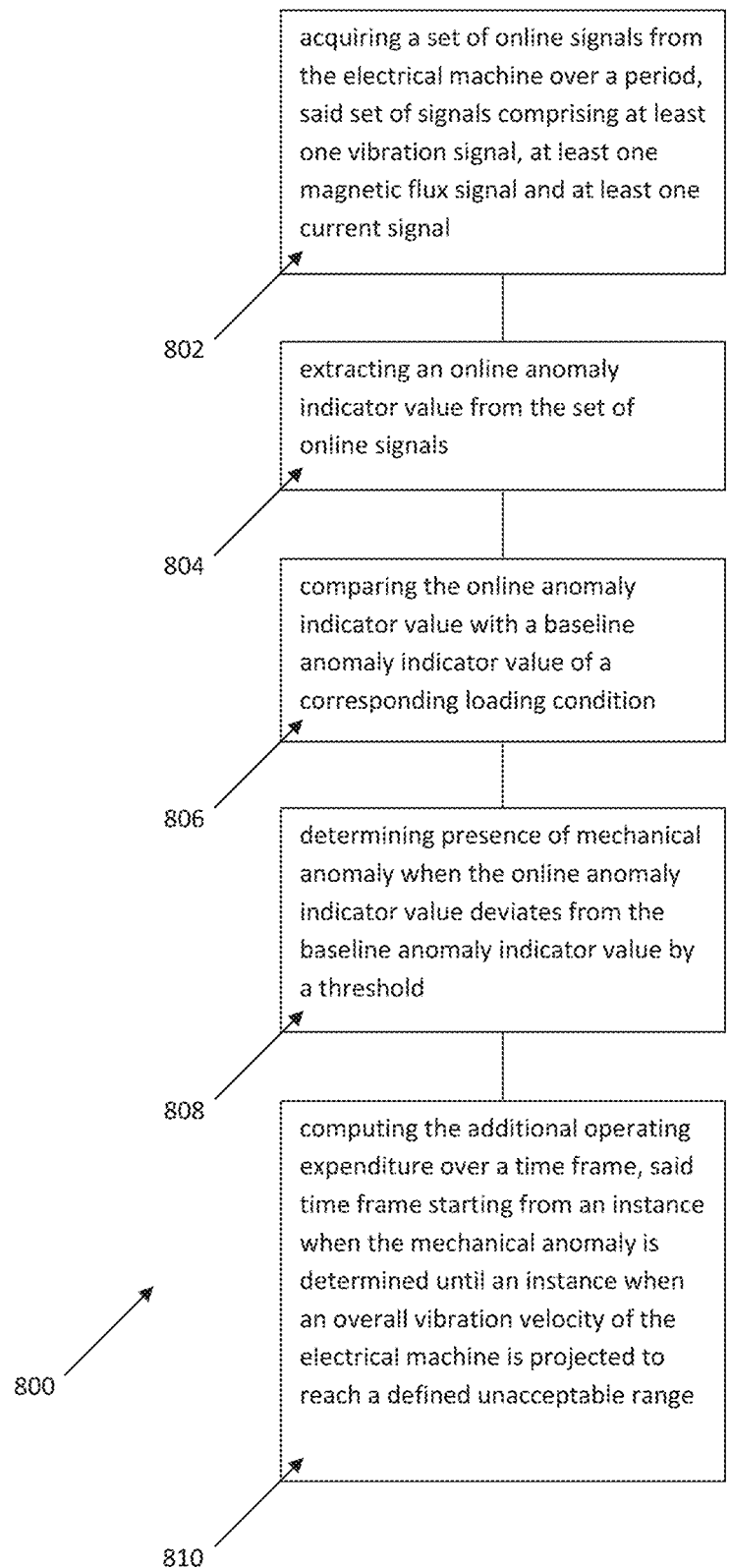
FIG. 8 is a schematic flowchart for illustrating a method of estimating an additional operating expenditure due to one or more mechanical anomalies in an electrical machine in an example embodiment.

FIG. 8 is a schematic flowchart 800 for illustrating a method of estimating an additional operating expenditure due to one or more mechanical anomalies in an electrical machine in an example embodiment. At step 802, a set of online signals is acquired from the electrical machine over a period, said set of online signals comprising at least one vibration signal, at least one magnetic flux signal and at least one current signal. At step 804, an online anomaly indicator value is extracted from the set of online signals. At step 806, the online anomaly indicator value is compared with a baseline anomaly indicator value of a corresponding loading condition. At step 808, the presence of mechanical anomaly is determined when the online anomaly indicator value deviates from the baseline anomaly indicator value by a threshold. At step 810, the additional operating expenditure over a time frame is computed, said time frame starting from an instance when the mechanical anomaly is determined until an instance when an overall vibration velocity of the electrical machine is projected to reach a defined unacceptable range. The anomaly indicator value may be obtained/computed using mechanical anomaly signatures e.g. frequency signatures which are characteristics of mechanical anomalies such as misalignment or unbalance or mechanical looseness. Frequency signatures may be extracted from the set of signals acquired from the electrical machine, e.g. summed end-shield leakage flux signal or line-/phase current.

The set of signals acquired from the electrical machine may include but is not limited to mechanical signals, magnetic signals and electrical signals. Mechanical signals may include but are not limited to vibration signals e.g. motor vibration signals such as acceleration. Magnetic signals may include but are not limited to magnetic flux signals e.g. magnetic leakage flux signals such as end-shield leakage flux signals. Electrical signals may include but are not limited to phase- or line-current of the electrical machine. In some example embodiments, the set of signals acquired from the electrical machine is one or more selected from the group consisting of vibration signal, magnetic leakage flux signal, and phase- or line-current of the electrical machine. In one example embodiment, the set of signals acquired from the electrical machine consists of at least one vibration signal and at least one phase- or line-current. In another example embodiment, the set of signals acquired from the electrical machine consists of at least one vibration signal and at least one magnetic leakage flux signal.

The magnetic signals e.g. magnetic flux signals may be measured under online operating conditions using sensors which include but are not limited to active Hall-effect based flux sensors or passive coils. The acquisition of magnetic flux signals may comprise positioning two or more flux sensors on the external surface of the electrical machine, prior to acquiring the set of signals from the electrical machine over a period. External surfaces of the electrical machine may include surfaces such as the outer/exterior aspects of the machine or exposed surfaces which include but are not limited to the outer/exterior aspects of the electrical machine. The external surfaces of the electrical machine are accessible from outside of the electrical machine without having to dismantle the machine. In one example, an external surface of an electrical machine, e.g. an induction motor (IM), may refer to an end shield of the IM. By positioning two or more flux sensors on the external surface of the electrical machine, the method may be performed while the machine is operating online. That is, the method may be performed without taking the electrical machine offline e.g. disconnecting the electrical machine from a power system network. In addition, by positioning two or more flux sensors on the external surface of the electrical machine, the method may be performed in a non-invasive manner, i.e. without substantially dismantling the machine e.g. dismantling of stator and rotor of a motor or generator.

The mechanical signals may be measured using motion sensors which are capable of measuring displacement, velocity and/or acceleration. Motor vibration signal e.g. acceleration can be measured using one or more motion sensors e.g. accelerometer. The accelerometer can be mounted on the outer surface of the motor either at the drive-end or non-drive-end, which senses the radial or axial or both accelerations. The acceleration measured by the accelerometer may be for example due to a vibration of the electrical machine. An (additional) acceleration/vibration of the electrical machine may arise if there is a mechanical anomaly in the electrical machine.

For electrical signals, it will be appreciated that current is inherent in most electrical systems and would be understood by a person skilled in the art. Current measurement may be acquired by the person skilled in the art using suitable methods and apparatus. For example, line/phase currents may be sensed using any of Current Transformers (CTs), Rogowski coils, shunt resistors and Hall-effect based current sensing instruments/sensors and the like.

The set of signals is acquired from the electrical machine over a period. The period refers to a time frame over which the set of signals is being acquired for use in detecting the presence of mechanical anomaly. The period may range from 1 second to 20 seconds, from 2 second to 19 seconds, from 3 second to 18 seconds, from 4 second to 17 seconds, from 5 second to 16 seconds, from 6 second to 15 seconds, from 7 second to 14 seconds, from 8 second to 13 seconds, from 9 second to 12 seconds, or from 10 second to 11 seconds.

The threshold may be denoted in percentages. For example, the presence of mechanical anomaly may be determined when the online anomaly indicator value deviates from the baseline anomaly indicator value by a threshold of at least about 1%, at least about 2%, at least about 3%, at least about 4%, at least about 5%, at least about 6%, at least about 7%, at least about 8%, at least about 9%, or at least about 10%. In one embodiment, the presence of mechanical anomaly is determined when the online anomaly indicator value deviates from the baseline anomaly indicator value by a minimum threshold of about 1%. Theoretically, a minimum threshold value setting of 1% greater than the baseline value is required for reliable abnormality detection. However, it will be appreciated that the threshold value setting is subjective, which can be up to 5% greater than the baseline value measured under healthy operating conditions.

In the example embodiment, the method may further comprise a calibration step e.g. an initial calibration, prior to the step of acquiring the set of online signals from the electrical machine. During calibration, a set of Baseline Load Values (BLVs) may be measured and stored in a database for various loading conditions. The set of BLVs may be one or more selected from the group consisting of speed value e.g. shaft speed value, slip value, and current value e.g. RMS value of a phase-current or line-current of the electrical machine. A Load Value Threshold (LVT) may be selected. The LVT may be ±1%, ±2%, ±3%, ±4%, ±5%, ±6%, ±7%, ±8%, ±9%, or ±10% of the BLVs. During calibration, a set of Baseline Anomaly Indicator Values (BAIVs) may also be measured and stored in a database for various loading conditions. Each BAIV represents the baseline value for a healthy electrical machine (i.e. without presence of rotor bar fault) under a defined loading condition. An Anomaly Indicator Threshold (AIT) may be selected. The AIT may be ±1%, ±2%, ±3%, ±4%, ±5%, ±6%, ±7%, ±8%, ±9%, or ±10% of the BAIVs.

The various loading conditions may range from a no-load (i.e. 0% loading) condition to a full-load (i.e. 100% loading) condition of the electrical machine. BLVs may be measured from 0% loading to 100% loading of the electrical machine in increments of 1% loading (e.g. 0%, 1%, 2%, 3%, 4%, 5% etc.), in increments of 2% loading (e.g. 0%, 2%, 4%, 6%, 8%, 10% etc.), in increments of 5% loading (e.g. 0%, 5%, 10%, 15%, 20%, 25% etc.), in increments of 10% loading (e.g. 0%, 10%, 20%, 30%, 40%, 50% etc.), or in increments of 20% loading (e.g. 0%, 20%, 40%, 60%, 80%, 100% etc.) of the electrical machine.

Example embodiments of the method may advantageously allow continuous online monitoring of the electrical machine for one or more mechanical anomalies, even while the machine is operating online. The method can be performed with sensors which can be easily retrofitted to the external surfaces of an existing machine e.g. motor or generator without dismantling the machine, thereby providing a non-invasive means to detect one or more mechanical anomalies and estimating additional operating expenditure due to the one or more mechanical anomalies. Even more advantageously, example embodiments of the method may be more sensitive as compared to conventional techniques. The multi-signature-based condition monitoring allows for anomaly detection under wide operating conditions and avoids spurious alarms.

Figure 9:
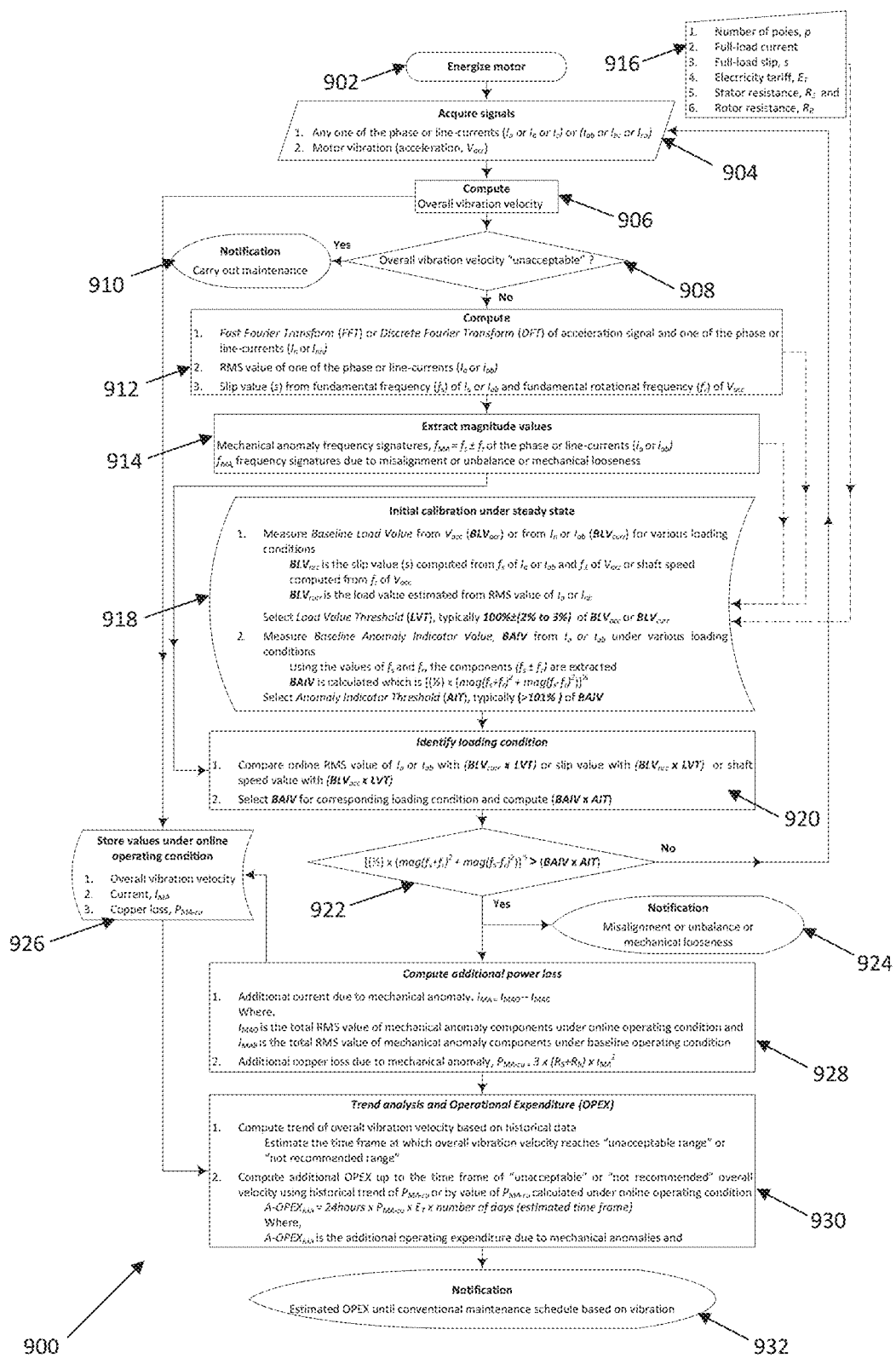
FIG. 9 is a schematic flowchart illustrating a method/technique of estimating an additional operating expenditure (OPEX) due to one or more mechanical anomalies in an electrical machine in an example embodiment.

FIG. 9 is a schematic flowchart 900 illustrating a method/technique of estimating an additional operating expenditure (OPEX) due to one or more mechanical anomalies in an electrical machine in an example embodiment. FIG. 9 illustrates one of the embodiments for OPEX calculation and early maintenance recommendation. A specially configured/designed monitoring system may be used to carry out the method of estimating an additional operating expenditure (OPEX) due to one or more mechanical anomalies in an electrical machine. The method as described in FIG. 9 comprises two different stages, namely calibration and online monitoring, both of which involve data acquisition, signal processing and magnitude extraction.

At step 902, the motor or generator is energized during online operation. An example embodiment of a motor or generator is shown in FIG. 2A and FIG. 2B. A motor may be energized by passing a varying electric current through the windings of its stator to produce varying magnetic fluxes such that the varying magnetic fluxes are capable of inducing the rotor and shaft member to rotate about their respective axis. A generator may be energized by driving its rotor and shaft member to rotate about their respective longitudinal axis to produce varying magnetic fluxes linked with the windings of its stator such that the varying magnetic fluxes are capable of inducing an electro motive force in the windings of the stator.

At step 904, a set of signals/data is acquired from the electrical machine over a period. The set of signals/data may be a set of baseline signals/data acquired from the electrical machine during calibration e.g. initial calibration. The set of signals/data may also be a set of online signals/data acquired from the electrical machine during online monitoring over a period. Data acquisition involves acquisition of signals such as motor vibration (acceleration, $V_{acc}$) and any one of the line-/phase-currents ($I_a$ or $I_b$ or $I_c$) or ($I_{ab}$ or $I_{bc}$ or $I_{ca}$). The motor vibration signal (acceleration, $V_{acc}$) may be acquired using one or more motion sensors e.g. accelerometers. The phase current or a line current of the electrical machine may be acquired using suitable methods and apparatus known in the art e.g. Current Transformers (CTs), Rogowski coils, shunt resistors and Hall-effect based current sensing instruments/sensors and the like.

At step 906, an overall vibration velocity is computed using the captured vibration signal. The overall vibration velocity is computed at regular intervals over a period and stored in a database as shown in step 926. The interval can vary from as low as 20 seconds to as high as a day with a period of 1 second to 20 seconds.

At step 908, the overall vibration velocity is checked against a reference range of vibration velocity values. A decision is determined whether the overall vibration velocity is at the "unacceptable" or "not recommended" value as per the standard, ISO 20816-1:2016. If the overall vibration velocity is outside the recommended range of values, the flowchart 900 proceeds to step 910. At step 910, a notification is triggered to inform a user to carry out maintenance of the electrical machine. If the overall velocity is within the recommended value, the flowchart 900 proceeds to step 912 where further signal processing is carried out.

At step 912, the acquired time-domain signals from step 904 are then converted to frequency-domain by Fast Fourier Transform (FFT) or Discrete Fourier Transform (DFT). A set of load values is then computed based on the various signals obtained. During the initial calibration stage, the computed set of load values are a set of baseline load values. During online monitoring, the computed set of load values are a set of online load values, which may be computed over a period of 1 second to 20 seconds. The set of load values may comprise a shaft speed value, slip value and RMS value of a phase-current or line-current of the electrical machine. For line- or phase-current, the RMS value is calculated in time-domain. The fundamental component, $f_s$ of the line-/phase-current is extracted from the frequency spectrum of the current. The fundamental component, $f_s$ is then used to identify the rotational frequency component $f_r$ in the frequency spectrum of the vibration signal. The frequency component which is close to $$\left(\frac{2}{p}f_s\right)$$

and less than $$\left(\frac{2}{p}f_s\right)$$

in me vibration spectrum is the fundamental rotational frequency component $f_r$. From $f_s$ and $f_r$, the value of slip is then calculated which is given by $$\left(\frac{f_s - f_r}{f_s}\right).$$

The shaft speed $$\left(\frac{120 f_r}{p}\right)$$

is computed from the fundamental rotational frequency component, $f_r$ from the spectrum of vibration signal.

At step 914, frequency signatures which are characteristics of mechanical anomalies such as misalignment or unbalance or mechanical looseness as given by $f_{MA}=f_s\pm f_r$ are extracted from the line-/phase current. The frequency signatures are then used for calculating an anomaly indicator value using the formula:

$$\sqrt{\frac{1}{2}[(\text{magnitude of } (f_s + f_r))^2 + (\text{magnitude of } (f_s - f_r))^2]}$$

The anomaly indicator value can be a baseline anomaly indicator value computed during the calibration stage or an online anomaly indicator value computed during the online monitoring stage.

It will be appreciated that the functionalities from step 902 to step 914 are executed for both online monitoring and calibration stages. Prior to the online monitoring stage, an initial calibration is carried out. An example of an initial calibration is shown in step 918 of FIG. 9. For the initial calibration and online monitoring stage, details such as number of poles (p), full-load current, full-load slip (s), electricity tariff ($E_T$), stator- and rotor-resistances ($R_s$ and $R_r$) of the equipment to be monitored are entered by the user in the monitoring system as shown in step 916.

At step 918, during initial calibration, a set of Baseline Load Values (BLVs) are measured and stored in a database for various loading conditions. The various loading conditions may range from a no-load (i.e. 0% loading) condition to a full-load (i.e. 100% loading) condition of the electrical machine. The set of BLVs may be one or more selected from the group consisting of shaft speed value, slip value, and RMS value of a phase current or line current of the electrical machine The BLVs can be from acceleration, $BLV_{acc}$ or from line- or phase-currents $I_a$ or $I_{ab}$ which is $BLV_{curr}$ The $BLV_{acc}$ is the slip value(s) computed from $f_s$ of the phase or line current and $f_r$ of $V_{acc}$; or the shaft speed $$\left(\frac{120 f_r}{p}\right)$$

computed from $f_r$ of $V_{acc}$. The $BLV_{curr}$ is the estimated loading values from the RMS values of current measured under online operating condition w.r.t (with respect to) full load current value entered by the user. A Load Value Threshold (LVT) is selected which is typically, 100±(2% to 3%) of $BLV_{acc}$ or $BLV_{curr}$. Practically, a tolerance of ±2% to ±3% would typically be sufficient to check whether estimated value of loading under online operating condition is within the baseline value.

Apart from BLVs, the initial calibration stage also involves computation of BAIV using the magnitude of frequency signatures in line-/phase-current due to mechanical anomalies as follows, $$\sqrt{\frac{1}{2}[(\text{magnitude of } (f_s + f_r))^2 + (\text{magnitude of } (f_s - f_r))^2]}$$

The BAIV under various loading conditions from no-load (0%) to full-load (100%) at an interval of 5% or 10% or 20% are computed and stored in a database. An Anomaly Indicator Threshold (AIT) is selected which is typically, >101% of BAIV. Theoretically, a minimum threshold value setting of 1% to 2% greater than the baseline value is required for reliable anomaly detection. However, it will be appreciated that the threshold value setting is subjective, which can be up to 5% greater than the baseline value measured under healthy operating conditions.

At step 920, during online monitoring of the electrical machine, a set of online load values is compared with the set of Baseline Load Values (BLVs) measured during initial calibration to identifying an appropriate loading condition corresponding to the set of online load values (i.e. "corresponding loading condition"). In the example embodiment, during the online monitoring stage, the RMS value of line-/phase-current or slip value or the shaft speed value is compared with baseline measurements ($BLV_{curr} \times LVT$) or ($BLV_{accx} \times LVT$). The appropriate loading condition is identified and its corresponding BAIV is selected which is then used to compare with online anomaly indicator value in step 922.

At step 922, the online anomaly indicator value is compared with the baseline anomaly indicator value of the corresponding loading condition. A decision is determined whether the online anomaly indicator value is greater than (BAIV×AIT), i.e. whether the online anomaly indicator value is greater than the BAIV by a threshold. If the determination at step 922 is positive (i.e. the online anomaly indicator value is greater than (BAIV×AIT)), the flowchart 900 proceeds to step 924 and 928. At step 924, a notification is triggered to indicate the presence of mechanical anomaly e.g. misalignment or mechanical looseness. At step 928, further processing is carried out to compute additional power loss due to the mechanical anomaly. If the determination at step 922 is negative, the flowchart 900 loops back to step 904 to acquire a new set of signals.

In the example embodiment, in addition to the detection of mechanical anomaly, computation and notification of additional power loss, trend analysis and OPEX are also carried out as shown in steps 928 and 930.

At step 928, the additional operating expenditure due to the mechanical anomaly is computed. Additional copper loss under mechanical anomaly condition is calculated using the formula $P_{MA-cu} = 3 \times (R_s + R_r) \times I_{MA}^2$. The $I_{MA}$ is the difference between RMS value of frequency signatures due to mechanical anomalies under online operating condition and baseline values measured and stored during initial calibration. The computed copper loss, additional current due to mechanical anomaly and overall vibration are stored in a database at a regular interval as shown by step 926. The interval can vary from as low as 20 seconds to as high as a day.

At step 930, a trend of the overall vibration velocity is computed based on the overall vibration velocity stored in the database at step 926. Using the historical data of overall vibration stored in the database, interpolation and extrapolation is carried out to estimate the time frame at which overall vibration velocity is projected to reach "unacceptable range" or "not recommended range" as per the standard, ISO 20816-1:2016. The additional OPEX, A-OPX$_{MA}$ due to mechanical anomalies up to the estimated time frame at which the overall vibration velocity is projected to reach "unacceptable range" is computed as shown in step 930. The A-OPX$_{MA}$ and P$_{MA-cu}$ provide insightful information about additional cost and machine loss, which could be used to schedule the maintenance much earlier when compared to conventional maintenance schedule based on vibration.

At step 932, a notification is triggered to provide an estimated OPEX until conventional maintenance schedule based on vibration.

Figure 10:
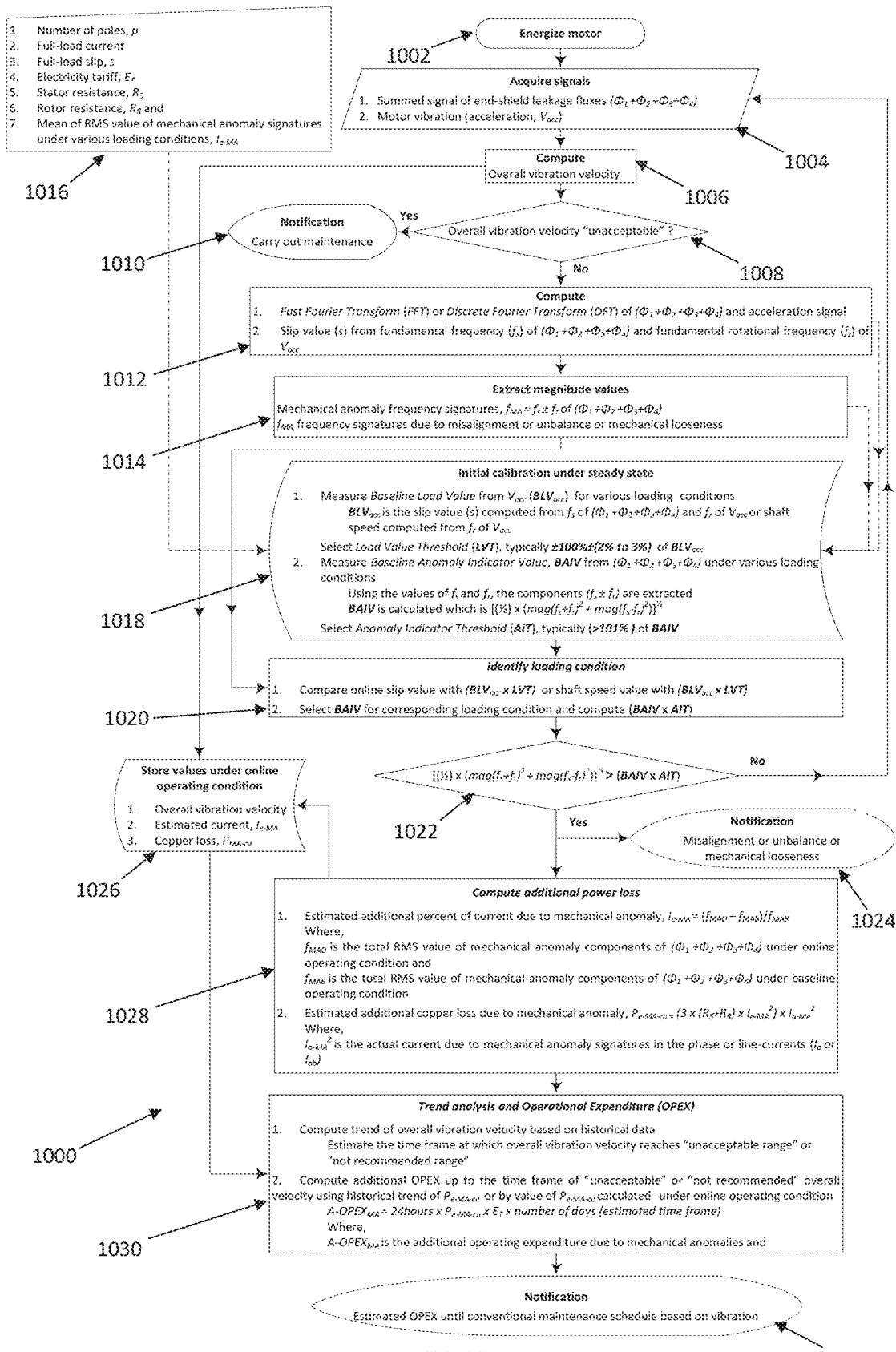
FIG. 10 is a schematic flowchart illustrating a method/technique of estimating an additional operating expenditure (OPEX) due to one or more mechanical anomalies in an electrical machine in another example embodiment.

FIG. 10 is a schematic flowchart 1000 illustrating a method/technique of estimating an additional operating expenditure (OPEX) due to one or more mechanical anomalies in an electrical machine in another example embodiment. FIG. 10 illustrates another embodiment for OPEX calculation and early maintenance recommendation based on summed end-shield leakage flux signal ($\varphi_1+\varphi_2+\varphi_3+\varphi_4$). A specially configured/designed monitoring system may be used to carry out the method of estimating an additional operating expenditure (OPEX) due to one or more mechanical anomalies in an electrical machine. The technique disclosed in FIG. 10 comprises two different stages, namely calibration and online monitoring, both of which involve data acquisition, signal processing and magnitude extraction.

At step 1002, the motor or generator is energized during online operation. An example embodiment of a motor or generator is shown in FIG. 2A and FIG. 2B. A motor may be energized by passing a varying electric current through the windings of its stator to produce varying magnetic fluxes such that the varying magnetic fluxes are capable of inducing the rotor and shaft member to rotate about their respective axis. A generator may be energized by driving its rotor and shaft member to rotate about their respective longitudinal axis to produce varying magnetic fluxes linked with the windings of its stator such that the varying magnetic fluxes are capable of inducing an electro motive force in the windings of the stator.

At step 1004, a set of signals/data is acquired from the electrical machine over a period. The set of signals/data may be a set of baseline signals/data acquired from the electrical machine during calibration e.g. initial calibration. The set of signals/data may also be a set of online signals/data acquired from the electrical machine during online monitoring over a period. Data acquisition involves acquisition of signals such as motor vibration (acceleration, $V_{acc}$) and summed end-shield leakage fluxes ($\varphi_1+\varphi_2+\varphi_3+\varphi_4$). For a p pole machine, p number of passive or Hall-effect based non-invasive magnetic flux sensors are mounted at angular displacement of $$\left(\frac{360°}{p}\right)$$

either on the drive-end or non-drive-end of the machine (compare 206 and 208 of FIGS. 2A and 2B respectively). In other words, p number of flux sensors is positioned proximate the stator along the circumference of its cylindrical frame (compare 202 of FIG. 2A and FIG. 2B), such that any two adjacent flux sensors along the circumference of the cylindrical frame has an angular separation of 360/p degrees with respect to the longitudinal axis of the cylindrical frame, wherein p represents the total number of poles of the motor or generator. A set of p leakage flux signals is acquired from the p number of flux sensors. The leakage fluxes measured/sensed by each of the flux sensors such as $\varphi_1$, $\varphi_2$, $\varphi_3$, $\varphi_4$ are then summed to obtain the summed signal ($\varphi_1+\varphi_2+\varphi_3+\varphi_4$) which are then acquired as shown in step 1004. The motor vibration signal (acceleration, $V_{acc}$) may be acquired using one or more motion sensors e.g. accelerometers.

At step 1006, an overall vibration velocity is computed using the captured vibration signal. The overall vibration velocity is computed at regular intervals over a period and stored in a database as shown in step 1026. The interval can vary from as low as 20 seconds to as high as a day with a period of 1 second to 20 seconds.

At step 1008, the overall vibration velocity is then checked against a reference range of vibration velocity values. A decision is determined whether the overall vibration velocity is at the "unacceptable" or "not recommended" value as per the standard, ISO 20816-1:2016. If the overall vibration velocity is outside the recommended range of values, the flowchart 1000 proceeds to step 1010. At step 1010, a notification is triggered to inform a user to carry out maintenance of the electrical machine. If the overall velocity is within the recommended value, the flowchart 1000 proceeds to step 1012 where further signal processing is carried out.

At step 1012, the acquired time-domain signals from step 1004 are then converted to frequency-domain by Fast Fourier Transform (FFT) or Discrete Fourier Transform (DFT). A set of load values is then computed based on the various signals obtained. During the initial calibration, the computed set of load values are a set of baseline load values. During online monitoring, the computed set of load values are a set of online load values, which may be computed during online monitoring over a period of 1 second to 20 seconds. The set of load values comprises a shaft speed value and slip value of the electrical machine. The slip value is given by $$\left(\frac{f_s - f_r}{f_s}\right),$$

where $f_s$ is the fundamental frequency of the summed end-shield leakage fluxes $(\varphi_1+\varphi_2+\varphi_3+\varphi_4)$ and $f_r$ is the fundamental rotational frequency of the motor vibration signal (acceleration, $V_{acc}$). The shaft speed $$\left(\frac{120 f_r}{p}\right)$$

is computed from me fundamental rotational frequency component, $f_r$ from the spectrum of vibration signal.

At step 1014, the summed end-shield leakage flux signal $(\varphi_1+\varphi_2+\varphi_3+\varphi_4)$ is used to extract the frequency signatures which are characteristic of mechanical anomalies. The frequency signatures are then used for calculating an anomaly indicator value using the formula:

$$\sqrt{\frac{1}{2}[(\text{magnitude of } (f_s + f_r))^2 + (\text{magnitude of } (f_s - f_r))^2]}$$

The anomaly indicator value can be a baseline anomaly indicator value computed during the calibration stage or an online anomaly indicator value computed during the online monitoring stage.

It will be appreciated that the functionalities from step 1002 to step 1014 are executed for both online monitoring and calibration stages. Prior to the online monitoring stage, an initial calibration is carried out. An example of an initial calibration is shown in step 1018 of FIG. 10. For the initial calibration and online monitoring stage, details such as number of poles (p), full-load current, full-load slip (s), electricity tariff ($E_T$), stator- and rotor-resistances ($R_s$ and $R_r$) and the mean of RMS value of mechanical anomaly signatures under various loading conditions ($I_a$-MA) of the equipment to be monitored are entered by the user in the monitoring system as shown in step 1016.

At step 1018, during initial calibration, a set of Baseline Load Values (BLVs) are measured and stored in a database for various loading conditions. The various loading conditions may range from a no-load (i.e. 0% loading) condition to a full-load (i.e. 100% loading) condition of the electrical machine. The set of BLVs may be one or more selected from the group consisting of shaft speed value and slip value of the electrical machine The BLVs can be from acceleration, $BLV_{acc}$. The $BLV_{acc}$ is the slip value computed from the fundamental frequency $f_s$ of the summed end-shield leakage fluxes $(\varphi_1+\varphi_2+\varphi_3+\varphi_4)$ and the fundamental rotational frequency $f_r$ of the motor vibration signal (acceleration, $V_{acc}$) for various loading conditions. The shaft speed $$\left(\frac{120 f_r}{p}\right)$$

can be computed from the fundamental rotational frequency $f_r$ of the motor vibration signal (acceleration, $V_{acc}$). A Load Value Threshold (LVT) is selected which is typically, 100%± (2% to 3%) of $BLV_{acc}$ or $BLV_{curr}$ Practically, a tolerance of ±2% to ±3% would typically be sufficient to check whether estimated value of loading under online operating condition is within the baseline value.

Apart from BLVs, the initial calibration stage also involves computation of BAIV using the magnitude of frequency signatures in the summed end-shield leakage flux signal due to mechanical anomalies as follows, $$\sqrt{\frac{1}{2}[(\text{magnitude of } (f_s + f_r))^2 + (\text{magnitude of } (f_s - f_r))^2]}$$

The BAIV under various loading conditions from no-load (0%) to full-load (100%) at an interval of 5% or 10% or 20% are computed and stored in a database. An Anomaly Indicator Threshold (AIT) is selected which is typically, >101% of BAIV. Theoretically, a minimum threshold value setting of 1% to 2% greater than the baseline value is required for reliable anomaly detection. However, it will be appreciated that the threshold value setting is subjective, which can be up to 5% greater than the baseline value measured under healthy operating conditions.

At step 1020, during online monitoring of the electrical machine, a set of online load values is compared with the set of Baseline Load Values (BLVs) measured during initial calibration to identifying an appropriate loading condition corresponding to the set of online load values (i.e. "corresponding loading condition"). In the example embodiment, during the online monitoring stage, the slip value or the shaft speed from vibration signal is compared with baseline measurements ($BLV_{acc}$×LVT). The appropriate loading condition is identified and its corresponding BAIV is selected which is then used to compare with online anomaly indicator value in step 1022.

At step 1022, the online anomaly indicator value is compared with the baseline anomaly indicator value of the corresponding loading condition. A decision is determined whether the online anomaly indicator value is greater than (BAIV×AIT), i.e. whether the online anomaly indicator value is greater than the BAIV by a threshold. If the determination at step 1022 is positive (i.e. the online anomaly indicator value is greater than (BAIV×AIT)), the flowchart 1000 proceeds to step 1024 and 1028. At step 1024, a notification is triggered to indicate the presence of mechanical anomaly e.g. misalignment or mechanical looseness. At step 1028, further processing is carried out to compute additional power loss due to the mechanical anomaly. If the determination at step 1022 is negative, the flowchart 1000 loops back to step 1004 to acquire a new set of signals.

In the example embodiment, in addition to the detection of mechanical anomaly, computation and notification of additional power loss, trend analysis and OPEX are also carried out as shown in step 1028 and 1030.

At step 1028, the additional operating expenditure due to the mechanical anomaly is computed. Additional copper loss under mechanical anomaly condition is calculated using the formula $P_{e-MA-cu}=(3\times(R_s+R_r)\times I_{e-MA}^2)\times I_{a-MA}^2$. The estimated value of additional percentage of current due to mechanical anomaly is represented in terms of summed end-shield leakage flux as $$I_{e-MA} = \frac{f_{MA0} - f_{MAB}}{f_{MAB}}.$$

The $I_{a-MA}$ Is me additional parameter required in this embodiment for equipment copper loss calculation. The mean of RMS value of mechanical anomaly signatures under various loading conditions is $I_{a-MA}$, which are to be entered by user during initial calibration stage as shown by step 1016. The computed copper loss, additional current due to mechanical anomaly and overall vibration are stored in a database at a regular interval of e.g., as low as 20 seconds to as high as a day as shown by step 1026.

At step 1030, a trend of the overall vibration velocity is computed based on the overall vibration velocity stored in the database at step 1026. Using the historical data of overall vibration stored in the database, interpolation and extrapolation is carried out to estimate the time frame at which overall vibration velocity is projected to reach "unacceptable range" or "not recommended range" as per the standard, ISO 20816-1:2016. The additional OPEX, A-OPX$_{MA}$ due to mechanical anomalies up to the estimated time frame at which the overall vibration velocity is projected to reach "unacceptable range" is computed as shown in step 1030. The A-OPX$_{MA}$ and P$_{e-MA-cu}$ provide insightful information about additional cost and machine loss, which could be used to schedule the maintenance much earlier when compared to conventional maintenance schedule based on vibration.

At step 1032, a notification is triggered to provide an estimated OPEX until conventional maintenance schedule based on vibration.

Figure 11:
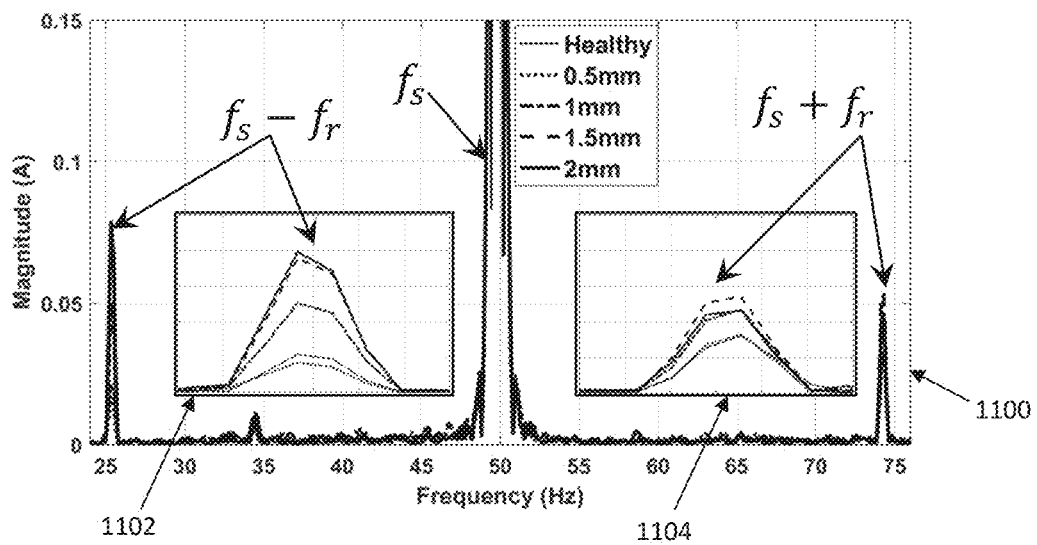
FIG. 11 is a graph presenting the frequency spectrum of one of the line-currents of a 10 hp, 3-phase induction motor under 74% loading condition.

Experimental Results of a Method of Estimating an Additional Operating Expenditure (OPEX) Due to One or More Mechanical Anomalies in an Electrical Machine FIG. 11 is a graph 1100 presenting the frequency spectrum of one of the line-currents of a 10 hp, 3-phase induction motor under 74% loading condition. Magnified views of sidebands $(f_s-f_r)$ and $(f_s+f_r)$ are shown in the boxes 1102 and 1104, respectively. It is evident that various increasing degrees of misalignment between motor and load cause the magnitude of frequency signatures $(f_s\pm f_r)$ to increase.

Figure 12A:
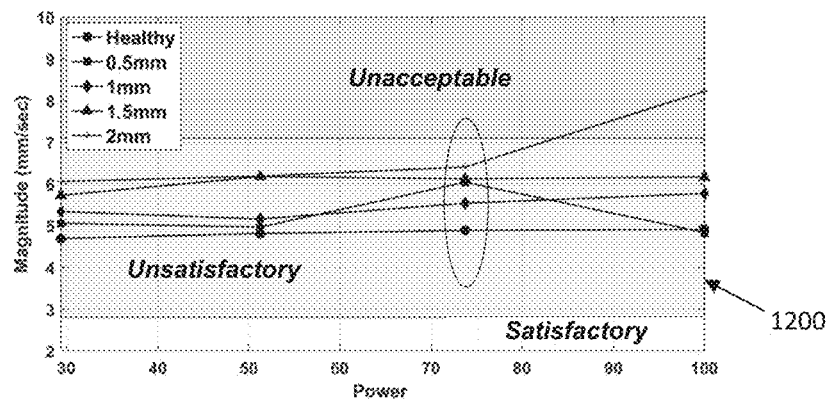
FIG. 12A is a graph presenting vibration velocities under various degrees of misalignment under different loading conditions.
Figure 12B:
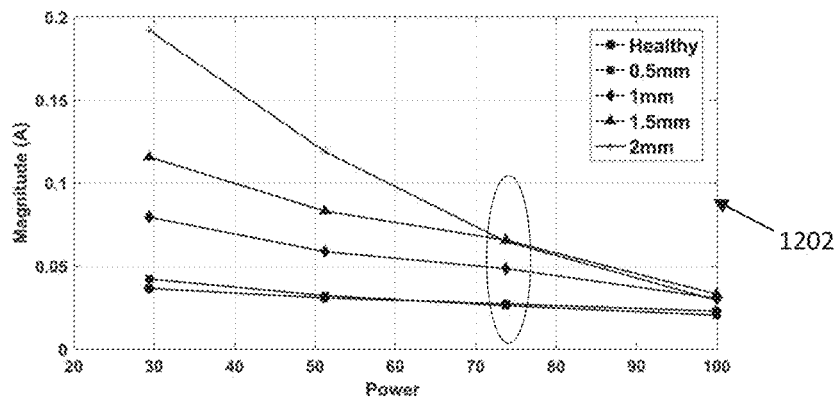
FIG. 12B is a graph presenting the total RMS value of $(f_s \pm f_r)$ components under various degrees of misalignment under different loading conditions.

FIG. 12A is a graph 1200 presenting vibration velocities under various degrees of misalignment under different loading conditions. FIG. 12B is a graph 1202 presenting the total RMS value of $(f_s\pm f_r)$ components under various degrees of misalignment under different loading conditions.

As shown from FIG. 12A, the overall vibration velocity of the equipment increases with the increase in the degree of misalignment. The encircled area of FIG. 12A presents the overall vibration velocity of the induction motor under 74% loading condition for various degrees of misalignment (measured in mm). The frequency spectrum of line-current for this corresponding loading condition is shown in FIG. 11. From FIG. 11 and FIG. 12A, it is evident that the magnitudes of frequency signatures in terminal current due to misalignment and the overall vibration velocity increases with the increase in the degree of misalignment. This phenomenon is evident in FIG. 12B, which presents the total RMS value of frequency signatures in terminal current due to misalignment.

From FIG. 12B, the current drawn by the motor under misalignment or other mechanical anomalies such as mechanical looseness or unbalance, increases with an increase in the degree of anomaly. It can be observed from FIG. 12A that, the overall vibration velocity for 74% load does not reach the unsatisfactory level. However, for the same loading condition, the total RMS value of $(f_s\pm f_r)$ components due to misalignment increases for various degrees of misalignment as shown by encircled area of FIG. 12B. Conventionally, maintenance is scheduled when the overall vibration velocity reaches an unacceptable range as per ISO standard or recommended value as fixed by a plant maintenance engineer. From FIG. 12A, although the overall vibration does not reach the unacceptable range (i.e., more than 7 mm/sec in magnitude) for 74% loading condition, the current drawn by the motor under misalignment increases with an increase in the degree of anomaly. As the frequency signatures $(f_s\pm f_r)$ are sub- and inter-harmonic components, copper loss increases which in turn increase temperature of stator and rotor thereby reduce the useful life span of the equipment and increase the OPEX. Hence, by considering power loss under misalignment and other mechanical anomalies such as looseness and unbalance conditions, an efficient maintenance schedule can be recommended.

In the described example embodiments, a non-invasive and sensitive online-technique to detect the presence of rotor bar faults e.g. broken-/cracked-rotor of electrical machines e.g. a rotating electromagnetic machine using end-shield leakage fluxes is provided. Additionally, Operational Expenditure (OPEX) reduction under mechanical anomalies such as misalignment or unbalance or mechanical looseness using end-shield leakage fluxes or terminal current is provided. The techniques as disclosed herein are online techniques which are advantageously capable of continuous monitoring around the clock.

In the described example embodiments, the techniques as disclosed herein are non-invasive and can be easily retrofitted to existing electromagnetic machines. The techniques as disclosed herein can be integrated with terminal currents and vibration signal of the electromagnetic rotating machine to enhance the fault detection capability under various loading conditions and schedule efficient maintenance. This may advantageously provide multi-signature-based condition monitoring capable of anomaly detection under a wide range of operating conditions and avoids spurious alarms. The online methodologies as disclosed herein may be applicable for all rotating electromagnetic machines used in electric vehicles, power plants, cranes, elevators, printing machines, rolling mills, cooling and ventilation systems, pumps for fluid circulation, marine and train propulsion systems, industries such as chemical, paper, pulp, cement, textile, packaging etc.

In the described example embodiments, the techniques as disclosed herein provide significant improvement over existing conventional techniques. Conventionally, broken-/cracked rotor fault is detected and diagnosed by Motor Current Signature Analysis (MCSA) and vibration signature analysis. In the described example embodiments, the online method for broken-/cracked-rotor bar fault detection based on summed end-shield leakage fluxes is non-invasive and 30% more sensitive than current- and vibration-based techniques which use the classical sidebands around the fundamental components. The online technique as disclosed herein may be capable of detecting broken-/cracked rotor bar relatively earlier with respect to existing techniques, thereby avoiding high repair-work cost or any catastrophic failures. Conventionally, vibration-based maintenance scheduling is widely adopted in industries, which does not consider the additional OPEX until the vibration level reaches "unacceptable" or "not recommended" value as per the ISO standard. In the described example embodiments, the online method as disclosed herein computes the additional OPEX that a user is being paid until the maintenance schedule is reached under mechanical anomalies in the equipment. The online method based on terminal current or summed end-shield leakage fluxes to compute the power loss and OPEX of the rotating electromagnetic induction machine under mechanical anomalies is capable of recommending early maintenance schedule with respect to conventional vibration-based maintenance schedule. Having an early and efficient maintenance schedule avoids the additional OPEX due to copper loss, avoids deterioration of asset health due to additional losses, and provides maximum utilization of equipment useful life-span.

The terms "coupled" or "connected" as used in this description are intended to cover both directly connected or connected through one or more intermediate means, unless otherwise stated.

The description herein may be, in certain portions, explicitly or implicitly described as algorithms and/or functional operations that operate on data within a computer memory or an electronic circuit. These algorithmic descriptions and/or functional operations are usually used by those skilled in the information/data processing arts for efficient description. An algorithm is generally relating to a self-consistent sequence of steps leading to a desired result. The algorithmic steps can include physical manipulations of physical quantities, such as electrical, magnetic or optical signals capable of being stored, transmitted, transferred, combined, compared, and otherwise manipulated.

Further, unless specifically stated otherwise, and would ordinarily be apparent from the following, a person skilled in the art will appreciate that throughout the present specification, discussions utilizing terms such as "scanning", "calculating", "determining", "replacing", "generating", "initializing", "outputting", and the like, refer to action and processes of an instructing processor/computer system, or similar electronic circuit/device/component, that manipulates/processes and transforms data represented as physical quantities within the described system into other data similarly represented as physical quantities within the system or other information storage, transmission or display devices etc.

The algorithms described herein can be implemented in a machine/apparatus specially configured for performing the steps of the described methods. Such apparatus may be specifically constructed for the purposes of the methods or may comprise a general-purpose computer/processor or other machine selectively activated or reconfigured by a computer program stored in a storage member. The algorithms and displays described herein are not inherently related to any computer or other apparatus. It is understood that general purpose devices/machines may be used in accordance with the teachings herein. Alternatively, the construction of a specialized machine/apparatus to perform the method steps may be desired.

For example, a system for detecting a rotor bar fault and a system of estimating an additional operating expenditure due to one or more mechanical anomalies in an electrical machine may be provided. The system may comprise a power supply unit for providing power to operate the system, a receiver unit for receiving a set of signals acquired from the machine over a period, a signal pre-processing unit for pre-processing the set of signals; and a Digital Signal Processor (DSP) or a Field Programmable Gate Array (FPGA) or a microcontroller or a microprocessor. The set of signals acquired from the electrical machine may include but is not limited to mechanical signals, magnetic signals and electrical signals. The DSP/FPGA/microcontroller/microprocessor may be configured to perform various tasks, such as, extracting an anomaly indicator value from the set of signals, comparing an online anomaly indicator value with a baseline anomaly indicator value of a corresponding loading condition, and determining the presence of rotor bar fault e.g. broken-/cracked rotor bar fault or mechanical anomaly (e.g. misalignment, unbalance or mechanical looseness) when the online anomaly indicator value deviates from the baseline anomaly indicator value by a threshold, and estimating operating expenditure due to one or more mechanical anomalies. The DSP/FPGA/microcontroller/microprocessor may also be configured to trigger a trip signal indicating presence of broken-/cracked rotor bar fault or mechanical anomaly when the broken-/cracked rotor bar fault or mechanical anomaly is determined. The system may further comprise a communication unit connected to a server e.g. cloud based IOT (Internet of things) server. For example, the system connected to a cloud based IOT server may be used for remote monitoring and detection of rotor bar fault or mechanical anomaly during online operation of an electrical machine.

In an example embodiment, a non-transitory tangible computer readable storage medium having stored thereon software instructions may be provided. The instructions, when executed by a specially configured computer processor of a system for detecting a rotor bar fault of an electrical machine, cause the computer processor to perform a method of detecting a rotor bar fault of an electrical machine, by executing the steps comprising acquiring a set of online signals from the electrical machine over a period, said set of online signals comprising at least one vibration signal and at least one magnetic flux signal; extracting an online anomaly indicator value from the set of online signals; comparing the online anomaly indicator value with a baseline anomaly indicator value of a corresponding loading condition; and determining presence of the broken or cracked rotor when the online anomaly indicator value deviates from the baseline anomaly indicator value by a threshold. It will be appreciated that the steps described herein may be non-sequential and may not be ordered as listed.

In another example embodiment, a non-transitory tangible computer readable storage medium having stored thereon software instructions may be provided. The instructions, when executed by a specially configured computer processor of a system for estimating an additional operating expenditure due to one or more mechanical anomalies in an electrical machine, cause the computer processor to perform a method of estimating an additional operating expenditure due to one or more mechanical anomalies in an electrical machine, by executing the steps comprising acquiring a set of online signals from the electrical machine over a period, said set of signals comprising at least one vibration signals, at least one magnetic flux signals and at least one current signal; extracting an online anomaly indicator value from the set of online signals; comparing the online anomaly indicator value with a baseline anomaly indicator value of a corresponding loading condition; determining presence of mechanical anomaly when the online anomaly indicator value deviates from the baseline anomaly indicator value by a threshold; and computing the additional operating expenditure over a time frame, said time frame starting from an instance when the mechanical anomaly is determined until an instance when an overall vibration velocity of the electrical machine is projected to reach a defined unacceptable range. It will be appreciated that the steps described herein may be non-sequential and may not be ordered as listed.

In addition, it is submitted that the description also implicitly covers a computer program, in that it would be clear that the steps of the methods described herein may be put into effect by computer code. It will be appreciated that a large variety of programming languages and coding can be used to implement the teachings of the description herein. Moreover, the computer program if applicable is not limited to any particular control flow and can use different control flows without departing from the scope of the invention.

Furthermore, one or more of the steps of the computer program if applicable may be performed in parallel and/or sequentially. Such a computer program if applicable may be stored on any computer readable medium. The computer readable medium may include storage devices such as magnetic or optical disks, memory chips, or other storage devices suitable for interfacing with a suitable reader/general purpose computer. In such instances, the computer readable storage medium is non-transitory. Such storage medium also covers all computer-readable media e.g. medium that stores data only for short periods of time and/or only in the presence of power, such as register memory, processor cache and Random Access Memory (RAM) and the like. The computer readable medium may even include a wired medium such as exemplified in the Internet system, or wireless medium such as exemplified in bluetooth technology. The computer program when loaded and executed on a suitable reader effectively results in an apparatus that can implement the steps of the described methods.

The example embodiments may also be implemented as hardware modules. A module is a functional hardware unit designed for use with other components or modules. For example, a module may be implemented using digital or discrete electronic components, or it can form a portion of an entire electronic circuit such as an Application Specific Integrated Circuit (ASIC). A person skilled in the art will understand that the example embodiments can also be implemented as a combination of hardware and software modules.

Additionally, when describing some embodiments, the disclosure may have disclosed a method and/or process as a particular sequence of steps. However, unless otherwise required, it will be appreciated the method or process should not be limited to the particular sequence of steps disclosed. Other sequences of steps may be possible. The particular order of the steps disclosed herein should not be construed as undue limitations. Unless otherwise required, a method and/or process disclosed herein should not be limited to the steps being carried out in the order written. The sequence of steps may be varied and still remain within the scope of the disclosure.

Further, in the description herein, the word "substantially" whenever used is understood to include, but not restricted to, "entirely" or "completely" and the like. In addition, terms such as "comprising", "comprise", and the like whenever used, are intended to be non-restricting descriptive language in that they broadly include elements/components recited after such terms, in addition to other components not explicitly recited. For an example, when "comprising" is used, reference to a "one" feature is also intended to be a reference to "at least one" of that feature. Terms such as "consisting", "consist", and the like, may, in the appropriate context, be considered as a subset of terms such as "comprising", "comprise", and the like. Therefore, in embodiments disclosed herein using the terms such as "comprising", "comprise", and the like, it will be appreciated that these embodiments provide teaching for corresponding embodiments using terms such as "consisting", "consist", and the like. Further, terms such as "about", "approximately" and the like whenever used, typically means a reasonable variation, for example a variation of +/−5% of the disclosed value, or a variance of 4% of the disclosed value, or a variance of 3% of the disclosed value, a variance of 2% of the disclosed value or a variance of 1% of the disclosed value.

Furthermore, in the description herein, certain values may be disclosed in a range. The values showing the end points of a range are intended to illustrate a preferred range. Whenever a range has been described, it is intended that the range covers and teaches all possible sub-ranges as well as individual numerical values within that range. That is, the end points of a range should not be interpreted as inflexible limitations. For example, a description of a range of 1% to 5% is intended to have specifically disclosed sub-ranges 1% to 2%, 1% to 3%, 1% to 4%, 2% to 3% etc., as well as individually, values within that range such as 1%, 2%, 3%, 4% and 5%. The intention of the above specific disclosure is applicable to any depth/breadth of a range.

Figure 13:
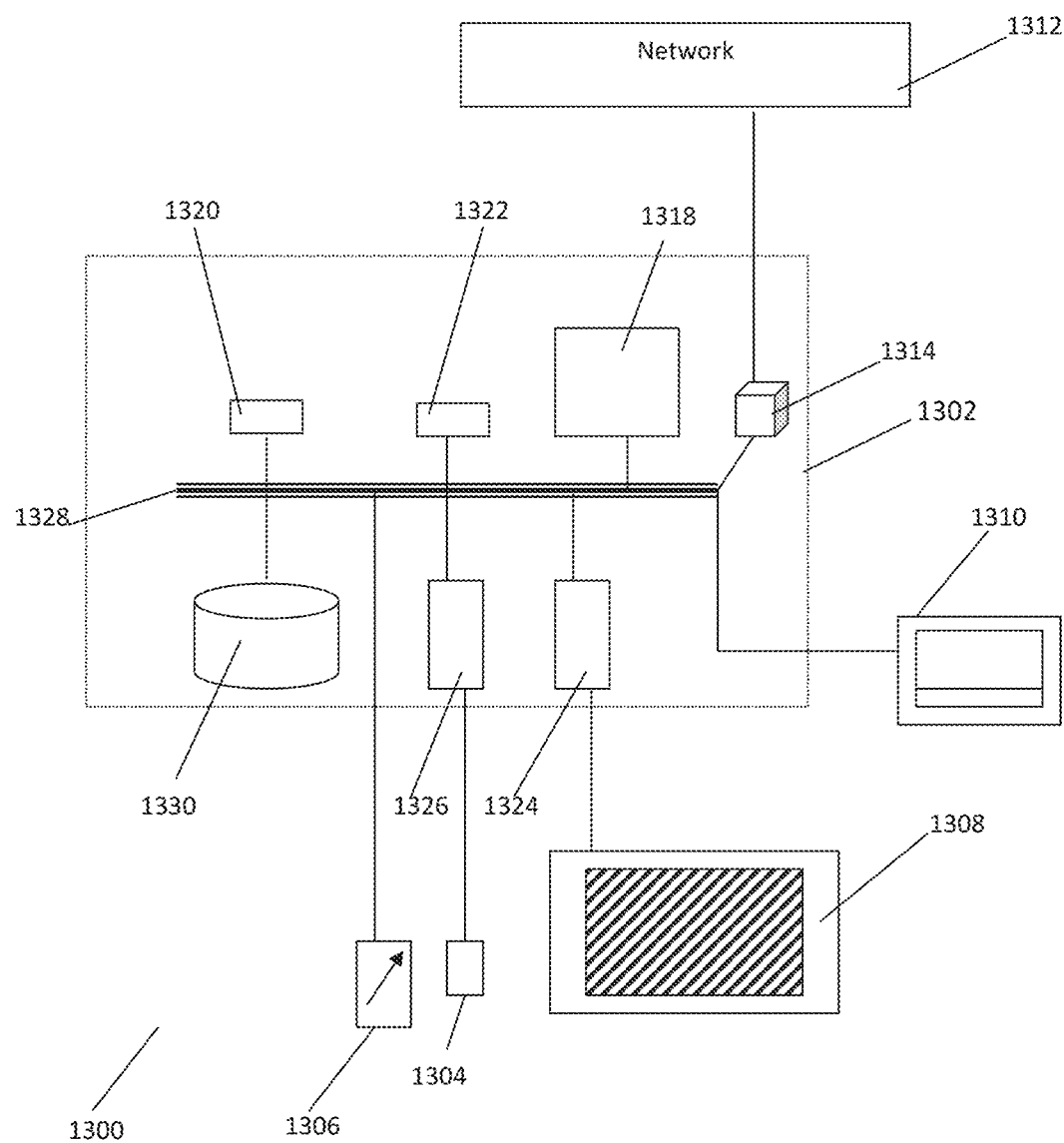
FIG. 13 is a schematic drawing of a computer system suitable for implementing an example embodiment.

Different example embodiments can be implemented in the context of data structure, program modules, program and computer instructions executed in a computer implemented environment. A general purpose computing environment is briefly disclosed herein. One or more example embodiments may be embodied in one or more computer systems, such as is schematically illustrated in FIG. 13.

One or more example embodiments may be implemented as software, such as a computer program being executed within a computer system 1300, and instructing the computer system 1300 to conduct a method of an example embodiment.

The computer system 1300 comprises a computer unit 1302, input modules such as a keyboard 1304 and a pointing device 1306 and a plurality of output devices such as a display 1308, and printer 1310. A user can interact with the computer unit 1302 using the above devices. The pointing device can be implemented with a mouse, track ball, pen device or any similar device. One or more other input devices (not shown) such as a joystick, game pad, satellite dish, scanner, touch sensitive screen or the like can also be connected to the computer unit 1302. The display 1308 may include a cathode ray tube (CRT), liquid crystal display (LCD), field emission display (FED), plasma display or any other device that produces an image that is viewable by the user.

The computer unit 1302 can be connected to a computer network 1312 via a suitable transceiver device 1314, to enable access to e.g. the Internet or other network systems such as Local Area Network (LAN) or Wide Area Network (WAN) or a personal network. The network 1312 can comprise a server, a router, a network personal computer, a peer device or other common network node, a wireless telephone or wireless personal digital assistant. Networking environments may be found in offices, enterprise-wide computer networks and home computer systems etc. The transceiver device 1314 can be a modem/router unit located within or external to the computer unit 1302, and may be any type of modem/router such as a cable modem or a satellite modem.

It will be appreciated that network connections shown are exemplary and other ways of establishing a communications link between computers can be used. The existence of any of various protocols, such as TCP/IP, Frame Relay, Ethernet, FTP, HTTP and the like, is presumed, and the computer unit 1302 can be operated in a client-server configuration to permit a user to retrieve web pages from a web-based server. Furthermore, any of various web browsers can be used to display and manipulate data on web pages.

The computer unit 1302 in the example comprises a processor 1318, a Random Access Memory (RAM) 1320 and a Read Only Memory (ROM) 1322. The ROM 1322 can be a system memory storing basic input/output system (BIOS) information. The RAM 1320 can store one or more program modules such as operating systems, application programs and program data.

The computer unit 1302 further comprises a number of Input/Output (I/O) interface units, for example I/O interface unit 1324 to the display 1308, and I/O interface unit 1326 to the keyboard 1304. The components of the computer unit 1302 typically communicate and interface/couple connectedly via an interconnected system bus 1328 and in a manner known to the person skilled in the relevant art. The bus 1328 can be any of several types of bus structures including a memory bus or memory controller, a peripheral bus, and a local bus using any of a variety of bus architectures.

It will be appreciated that other devices can also be connected to the system bus 1328. For example, a universal serial bus (USB) interface can be used for coupling a video or digital camera to the system bus 1328. An IEEE 1394 interface may be used to couple additional devices to the computer unit 1302. Other manufacturer interfaces are also possible such as FireWire developed by Apple Computer and i.Link developed by Sony. Coupling of devices to the system bus 1328 can also be via a parallel port, a game port, a PCI board or any other interface used to couple an input device to a computer. It will also be appreciated that, while the components are not shown in the figure, sound/audio can be recorded and reproduced with a microphone and a speaker. A sound card may be used to couple a microphone and a speaker to the system bus 1328. It will be appreciated that several peripheral devices can be coupled to the system bus 1328 via alternative interfaces simultaneously.

An application program can be supplied to the user of the computer system 1300 being encoded/stored on a data storage medium such as a CD-ROM or flash memory carrier. The application program can be read using a corresponding data storage medium drive of a data storage device 1330. The data storage medium is not limited to being portable and can include instances of being embedded in the computer unit 1302. The data storage device 1330 can comprise a hard disk interface unit and/or a removable memory interface unit (both not shown in detail) respectively coupling a hard disk drive and/or a removable memory drive to the system bus 1328. This can enable reading/writing of data. Examples of removable memory drives include magnetic disk drives and optical disk drives. The drives and their associated computer-readable media, such as a floppy disk provide non-volatile storage of computer readable instructions, data structures, program modules and other data for the computer unit 1302. It will be appreciated that the computer unit 1302 may include several of such drives. Furthermore, the computer unit 1302 may include drives for interfacing with other types of computer readable media.

The application program is read and controlled in its execution by the processor 1318. Intermediate storage of program data may be accomplished using RAM 1320. The method(s) of the example embodiments can be implemented as computer readable instructions, computer executable components, or software modules. One or more software modules may alternatively be used. These can include an executable program, a data link library, a configuration file, a database, a graphical image, a binary data file, a text data file, an object file, a source code file, or the like. When one or more computer processors execute one or more of the software modules, the software modules interact to cause one or more computer systems to perform according to the teachings herein.

The operation of the computer unit 1302 can be controlled by a variety of different program modules. Examples of program modules are routines, programs, objects, components, data structures, libraries, etc. that perform particular tasks or implement particular abstract data types. The example embodiments may also be practiced with other computer system configurations, including handheld devices, multiprocessor systems, microprocessor-based or programmable consumer electronics, network PCs, minicomputers, mainframe computers, personal digital assistants, mobile telephones and the like. Furthermore, the example embodiments may also be practiced in distributed computing environments where tasks are performed by remote processing devices that are linked through a wireless or wired communications network. In a distributed computing environment, program modules may be located in both local and remote memory storage devices.

It will be appreciated by a person skilled in the art that other variations and/or modifications may be made to the specific embodiments without departing from the scope of the invention as broadly described. For example, in the description herein, features of different example embodiments may be mixed, combined, interchanged, incorporated, adopted, modified, included etc. or the like across different example embodiments. The present embodiments are, therefore, to be considered in all respects to be illustrative and not restrictive.

The invention claimed is:

1. A method of detecting a rotor bar fault of an electrical machine, said method comprising,
    acquiring a set of online signals from the electrical machine over a period, said set of online signals comprising at least one vibration signal, and a summed signal of magnetic flux signals, each magnetic flux signal obtained from a respective flux sensor positioned on an external surface of the electrical machine,
    wherein the summed signal of magnetic flux signals is obtained by acquiring and summing a set of p flux signals to obtain a total flux signal, wherein the set of p flux signals is acquired from p flux sensors positioned along a circumference of a cylindrical frame of the electrical machine, such that any two adjacent flux sensors along the circumference of the cylindrical frame have an angular separation of 360/p degrees with respect to the longitudinal axis of the cylindrical frame, wherein p represents the total number of poles of the electrical machine;

extracting an online anomaly indicator value from the set of online signals;

comparing the online anomaly indicator value with a baseline anomaly indicator value of a corresponding loading condition; and determining presence of a broken or cracked rotor when the online anomaly indicator value deviates from the baseline anomaly indicator value by a threshold.

2. The method of claim 1, wherein the electrical machine is a motor or generator comprising,
a stator having a cylindrical frame, the cylindrical frame comprising a plurality of electrically conductive windings arranged therein;
a rotor having a cylindrical body concentrically mounted and rotatable within the cylindrical frame of the stator, said rotor having a drive end and a non-drive end; and
an elongated shaft member coaxially mounted to the rotor, said shaft member protruding from the rotor at the drive end.

3. The method of claim 2, wherein acquiring the set of online signals from the electrical machine comprises,
acquiring and summing a set of p flux signals to obtain a total flux signal, wherein the set of p flux signals is acquired from p flux sensors positioned proximate the stator along the circumference of its cylindrical frame, such that any two adjacent flux sensors along the circumference of the cylindrical frame have an angular separation of 360/p degrees with respect to the longitudinal axis of the cylindrical frame, wherein p represents the total number of poles of the motor or generator;
acquiring one or more vibration signals from an accelerometer; and optionally
acquiring either a phase current or a line current of the electrical machine.

4. The method of claim 3, further comprising,
computing a set of online load values from the set of online signals, said set of online load values is one or more selected from the group consisting of shaft speed value, slip value and RMS value of a phase current or line current of the electrical machine.

5. The method of claim 3, wherein extracting the online anomaly indicator value from the set of online signals comprises computing an RMS value of magnitudes of one or more frequency components of the total flux signal, said frequency components associated with the rotor bar fault.

6. The method of claim 5, wherein computing the RMS value comprises
performing a Fourier transform on the total flux signal; and
extracting magnitudes of frequency components from the frequency spectrum of the total flux signal.

7. The method of claim 2, further comprising performing an initial calibration of the electrical machine when the electrical machine is in a healthy condition, prior to the acquiring of the set of online signals, the initial calibration comprising,
acquiring and storing a set of baseline load values under a range of loading conditions from no-load condition to full-load condition,
wherein the set of baseline load values is one or more selected from the group consisting of shaft speed value, slip value, and RMS value of a phase current or line current of the electrical machine.

8. The method of claim 7, wherein the initial calibration further comprises extracting a set of baseline anomaly indicator values corresponding to a set of loading conditions ranging from no-load condition to full-load condition, when the electrical machine is in the healthy condition;
wherein extracting a baseline anomaly indicator value for a corresponding loading condition comprises,
acquiring and summing a set of p flux signals to obtain a total flux signal for the corresponding loading condition;
performing a Fourier transform on the total flux signal to obtain a magnitude of the total flux signal; and
extracting a magnitude of frequency components from a frequency spectrum of the total flux signal.

9. The method of claim 7, further comprising identifying the corresponding loading condition, prior to comparing the online anomaly indicator value with the baseline anomaly indicator value of the corresponding loading condition,
wherein the step of identifying the corresponding loading condition comprises,
comparing the set of online load values from the electrical machine with the set of baseline load values to identify the corresponding loading condition; and
selecting the baseline anomaly indicator value for the identified corresponding loading condition.

10. The method of claim 2, further comprising providing input of parameter values of the electrical machine, said parameter values comprising number of poles, full-load current and full-load slip of the electrical machine.

11. A non-transitory computer readable storage medium having stored thereon instructions for instructing a processing unit of a system to execute a method of detecting a broken or cracked rotor bar during online operation of an electrical machine, said method comprising,
acquiring a set of online signals from the electrical machine over a period, said set of online signals comprising at least one vibration signal, a summed signal of magnetic flux signals, each magnetic flux signal obtained from a respective flux sensor positioned on an external surface of the electrical machine,
wherein the summed signal of magnetic flux signals is obtained by acquiring and summing a set of p flux signals to obtain a total flux signal, wherein the set of p flux signals is acquired from p flux sensors positioned along a circumference of a cylindrical frame of the electrical machine, such that any two adjacent flux sensors along the circumference of the cylindrical frame have an angular separation of 360/p degrees with respect to the longitudinal axis of the cylindrical frame, wherein p represents the total number of poles of the electrical machine;
extracting an online anomaly indicator value from the set of online signals;
comparing the online anomaly indicator value with a baseline anomaly indicator value of a corresponding loading condition; and
determining presence of a broken or cracked rotor when the online anomaly indicator value deviates from the baseline anomaly indicator value by a threshold.

12. A method of estimating an additional operating expenditure due to one or more mechanical anomalies in an electrical machine, the method comprising,
acquiring a set of online signals from the electrical machine over a period, said set of signals comprising at least one vibration signal, at least one magnetic flux signal and at least one current signal;

extracting an online anomaly indicator value from the set of online signals;

comparing the online anomaly indicator value with a baseline anomaly indicator value of a corresponding loading condition;

determining presence of mechanical anomaly when the online anomaly indicator value deviates from the baseline anomaly indicator value by a threshold; and computing the additional operating expenditure over a time frame, said time frame starting from an instance when the mechanical anomaly is determined until an instance when an overall vibration velocity of the electrical machine is projected to reach a defined unacceptable range.

13. The method of claim 12, wherein the electrical machine is a motor or generator comprising, a stator having a cylindrical frame, the cylindrical frame comprising a plurality of electrically conductive windings arranged therein;

a rotor having a cylindrical body concentrically mounted and rotatable within the cylindrical frame of the stator, said rotor having a drive end and a non-drive end; and an elongated shaft member coaxially mounted to the rotor, said shaft member protruding from the rotor at the drive end.

14. The method of claim 13, wherein acquiring the set of online signals from the electrical machine comprises, acquiring at least one vibration signal from an accelerometer;

acquiring and summing a set of p flux signals to obtain a total flux signal, wherein the set of p flux signals is acquired from p flux sensors positioned proximate the stator along the circumference of its cylindrical frame, such that any two adjacent flux sensors along the circumference of the cylindrical frame have an angular separation of 360/p degrees with respect to the longitudinal axis of the cylindrical frame, wherein p represents the total number of poles of the motor or generator; and acquiring either a phase current or a line current of the electrical machine.

15. The method of claim 14, further comprising, computing a set of online load values from the set of online signals, said set of online load values is one or more selected from the group consisting of shaft speed value, slip value and RMS value of a phase current or line current of the electrical machine.

16. The method of claim 14, wherein extracting the online anomaly indicator value from the set of signals comprises, computing an RMS value of magnitudes of one or more frequency components of the total flux signal, or an RMS value of magnitudes of one or more frequency components of the phase or line current, said frequency components associated with the mechanical anomaly.

17. The method of claim 16, wherein computing the RMS value comprises performing a Fourier transform on the total flux signal or the phase or line current; and extracting magnitudes of frequency components from the frequency spectrum of the total flux signal or the phase or line current.

18. The method of claim 13, further comprising performing an initial calibration of the electrical machine when the electrical machine is in a healthy condition, prior to the acquiring of the set of online signals, the initial calibration comprising, acquiring and storing a set of baseline load values under a range of loading conditions from no-load condition to full-load condition, wherein the set of baseline load values is one or more selected from the group consisting of shaft speed value, slip value, and RMS value of a phase current or line current of the electrical machine.

19. The method of claim 18, wherein the initial calibration further comprises extracting a set of baseline anomaly indicator values corresponding to a set of loading conditions ranging from no-load condition to full-load condition, when the electrical machine is in the healthy condition.

20. The method of claim 18, further comprising identifying the corresponding loading condition, prior to comparing the online anomaly indicator value with the baseline anomaly indicator value of the corresponding loading condition, wherein the step of identifying the corresponding loading condition comprises, comparing the set of online load values from the electrical machine with the set of baseline load values to identify the corresponding loading condition; and selecting the baseline anomaly indicator value for the corresponding loading condition.

21. The method of claim 12, wherein computing the additional operating expenditure over the time frame comprises, computing power loss, additional current due to the one or more mechanical anomalies, and overall vibration velocity at regular time intervals; and storing the computed power loss, additional current due to the one or more mechanical anomalies, and overall vibration velocity in a database.

22. The method of claim 21, wherein computing the additional operating expenditure over the time frame further comprises, computing a trend of the overall vibration velocity based on the computed overall vibration velocity stored in the database;

determining from the trend of the overall vibration velocity, the instance when an overall vibration velocity of the electrical machine is at the defined unacceptable range; and computing the additional operating expenditure over the time frame.

23. The method of claim 13, further comprising inputting parameter values of the electrical machine, said parameter values comprising number of poles, full-load current, full-load slip, electricity tariff, stator resistance, rotor resistance, and RMS value of actual current due to mechanical anomaly signatures in the phase or line current.

24. The method of claim 12, further comprising prior to the extracting of online anomaly indicator value from the set of online signals, obtaining an overall vibration velocity of the electrical machine from the at least one vibration signal;

comparing the overall vibration velocity with a recommended value or range of values for the vibration velocity of the electrical machine; and triggering a signal for maintenance when the overall vibration velocity deviates from the recommended value or range of values.

25. A non-transitory computer readable storage medium having stored thereon instructions for instructing a processing unit of a system to execute a method of estimating an additional operating expenditure due to one or more mechanical anomalies in an electrical machine, said method comprising,
- acquiring a set of online signals from the electrical machine over a period, said set of signals comprising at least one vibration signal, at least one magnetic flux signal and at least one current signal;
- extracting an online anomaly indicator value from the set of online signals;
- comparing the online anomaly indicator value with a baseline anomaly indicator value of a corresponding loading condition;
- determining presence of mechanical anomaly when the online anomaly indicator value deviates from the baseline anomaly indicator value by a threshold; and
- computing the additional operating expenditure over a time frame, said time frame starting from an instance when the mechanical anomaly is detected until an instance when an overall vibration velocity of the electrical machine reaches a defined unacceptable range.

* * * * *